United States Patent [19]

Fogg, Jr. et al.

[11] Patent Number: 5,721,953
[45] Date of Patent: *Feb. 24, 1998

[54] INTERFACE FOR LOGIC SIMULATION USING PARALLEL BUS FOR CONCURRENT TRANSFERS AND HAVING FIFO BUFFERS FOR SENDING DATA TO RECEIVING UNITS WHEN READY

[75] Inventors: Richard Gregory Fogg, Jr.; Mark David Sweet, both of Austin, Tex.

[73] Assignee: International Business Machines Corporation, Armonk, N.Y.

[*] Notice: The term of this patent shall not extend beyond the expiration date of Pat. No. 5,548,785.

[21] Appl. No.: 626,101

[22] Filed: Apr. 3, 1996

Related U.S. Application Data

[63] Continuation of Ser. No. 91,521, Jul. 14, 1993, Pat. No. 5,548,785, which is a continuation of Ser. No. 502,147, Mar. 30, 1990, abandoned.

[51] Int. Cl.$^6$ ........................................ G06F 3/00
[52] U.S. Cl. .................. 395/841; 395/500; 364/229.2; 364/239.7
[58] Field of Search .................. 364/57, 200, 229.2, 364/239.7; 395/841, 500

[56] References Cited

U.S. PATENT DOCUMENTS

| | | | |
|---|---|---|---|
| 4,306,286 | 12/1981 | Cocke et al. | 364/200 |
| 4,724,520 | 2/1988 | Athanas et al. | 364/200 |
| 5,548,785 | 8/1996 | Fogg, Jr. et al. | 395/841 |

OTHER PUBLICATIONS

Arnold et al., "A hierarchical, restructurable multi-microprocessor architecture", 1976, pp. 40–45, Publisher: IEEE, New York, NY, USA.

*Primary Examiner*—Thomas C. Lee
*Assistant Examiner*—David Ton
*Attorney, Agent, or Firm*—Volel Emile

[57] ABSTRACT

A host interface for a logic simulation machine for transferring data between the logic simulation machine and a host computer is disclosed. The host interface includes a First-In First-Out buffer provided between the logic simulation machine and the host computer for temporarily storing data being transferred between the logic simulation machine and the host computer until a receiver of the data is ready to receive the data. The host interface minimizes delays due to host interaction with the logic simulation machine during the communication between the host and the logic simulation machine.

12 Claims, 17 Drawing Sheets

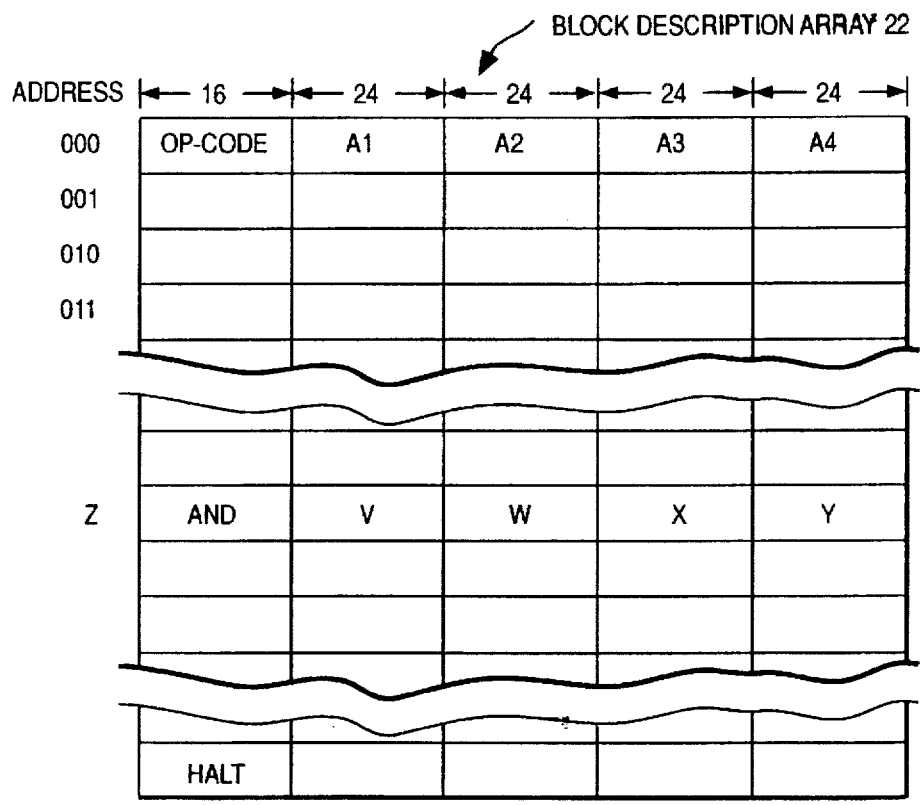
FIG. 3
| OP - CODE | | | | | | | | | | | | | |
|---|---|---|---|---|---|---|---|---|---|---|---|---|---|
| 1 | | | | | | | | | | | | | BLOCK DESCRIPTION |
| R R | | | | | | | | | | | | | RESERVED |
| | | I1 | | | | | | | | | | | INVERT OPERAND 1 |
| | | | I2 | | | | | | | | | | INVERT OPERAND 2 |
| | | | | I3 | | | | | | | | | INVERT OPERAND 3 |
| | | | | | I4 | | | | | | | | INVERT OPERAND 4 |
| | | | | | | I0 | | | | | | | INVERT OUTPUT |
| | | | | | | | F | F | F | F | F | F F | FUNCTIONAL POINTER |
| 0 | | | | | | | | | | | | | CONTROL INSTRUCTION |
| r | r | x | x | x | x | x 0 | 0 | x | x | x | x | x | HALT |
| | | I1 I2 I3 I4 x 0 | | | | 1 | | | | | | | BROADCAST END |
| | | I1 I2 I3 I4 x 1 | | | | 0 | | | | | | | BROADCAST |
| | | I1 I2 x x I0 1 | | | | 1 | f | f | f | f | f | f | BRANCH |
FIG. 4
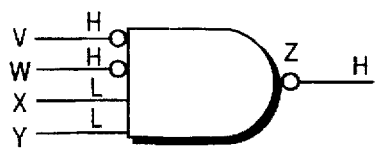
FIG. 5

INSTRUCTION
LIST
ADDRESS

| Address | Instruction |
|---|---|
| 000 0 | GATE 0. BLOCK DESCRIPTION INSTRUCTION FOR 1ST SIMULATION PROCESSOR |
| 000 1 | GATE 1. BLOCK DESCRIPTION INSTRUCTION FOR 2ND SIMULATION PROCESSOR |
| 000 2 | GATE 2. BLOCK DESCRIPTION INSTRUCTION FOR 3RD SIMULATION PROCESSOR |
| 000 3 | GATE 3. BLOCK DESCRIPTION INSTRUCTION FOR 4TH SIMULATION PROCESSOR |
| 000 4 | GATE 4. BLOCK DESCRIPTION INSTRUCTION FOR 5TH SIMULATION PROCESSOR |
| 000 5 | GATE 5. BLOCK DESCRIPTION INSTRUCTION FOR 6TH SIMULATION PROCESSOR |
| 000 6 | GATE 6. BLOCK DESCRIPTION INSTRUCTION FOR 7TH SIMULATION PROCESSOR |
| 000 7 | GATE 7. BLOCK DESCRIPTION INSTRUCTION FOR 8TH SIMULATION PROCESSOR |
| 000 8 | GATE 8. BLOCK DESCRIPTION INSTRUCTION FOR 9TH SIMULATION PROCESSOR |
| 000 9 | GATE 9. BLOCK DESCRIPTION INSTRUCTION FOR 10TH SIMULATION PROCESSOR |
| 000 A | GATE 10. BLOCK DESCRIPTION INSTRUCTION FOR 11TH SIMULATION PROCESSOR |
| 000 B | GATE 11. BLOCK DESCRIPTION INSTRUCTION FOR 12TH SIMULATION PROCESSOR |
| 000 C | GATE 12. BLOCK DESCRIPTION INSTRUCTION FOR 13TH SIMULATION PROCESSOR |
| 000 D | GATE 13. BLOCK DESCRIPTION INSTRUCTION FOR 14TH SIMULATION PROCESSOR |
| 000 E | GATE 14. BLOCK DESCRIPTION INSTRUCTION FOR 15TH SIMULATION PROCESSOR |
| 000 F | GATE 15. BLOCK DESCRIPTION INSTRUCTION FOR 16TH SIMULATION PROCESSOR |
| 001 0 | GATE 16. BLOCK DESCRIPTION INSTRUCTION FOR 1ST SIMULATION PROCESSOR |
| 001 1 | GATE 17. BLOCK DESCRIPTION INSTRUCTION FOR 2ND SIMULATION PROCESSOR |
| 001 2 | GATE 18. BLOCK DESCRIPTION INSTRUCTION FOR 3RD SIMULATION PROCESSOR |
| OFF 0 | BROADCAST INSTRUCTION FOR 1ST SIMULATION PROCESSOR |
| OFF 1 | BROADCAST INSTRUCTION FOR 2ND SIMULATION PROCESSOR |
| OFF 2 | BROADCAST INSTRUCTION FOR 3RD SIMULATION PROCESSOR |
| OFF 3 | BROADCAST INSTRUCTION FOR 4TH SIMULATION PROCESSOR |
| OFF 4 | BROADCAST INSTRUCTION FOR 5TH SIMULATION PROCESSOR |
| OFF 5 | BROADCAST INSTRUCTION FOR 6TH SIMULATION PROCESSOR |
| OFF 6 | BROADCAST INSTRUCTION FOR 7TH SIMULATION PROCESSOR |
| OFF 7 | BROADCAST INSTRUCTION FOR 8TH SIMULATION PROCESSOR |
| OFF 8 | BROADCAST INSTRUCTION FOR 9TH SIMULATION PROCESSOR |
| OFF 9 | BROADCAST INSTRUCTION FOR 10TH SIMULATION PROCESSOR |
| OFF A | BROADCAST INSTRUCTION FOR 11TH SIMULATION PROCESSOR |
| OFF B | BROADCAST INSTRUCTION FOR 12TH SIMULATION PROCESSOR |
| OFF C | BROADCAST INSTRUCTION FOR 13TH SIMULATION PROCESSOR |
| OFF D | BROADCAST INSTRUCTION FOR 14TH SIMULATION PROCESSOR |
| OFF E | BROADCAST INSTRUCTION FOR 15TH SIMULATION PROCESSOR |
| OFF F | BROADCAST INSTRUCTION FOR 16TH SIMULATION PROCESSOR |
| 100 0 | |

INSTRUCTION
LIST
ADDRESS

| | |
|---|---|
| FFE F | |
| FFF 0 | HALT INSTRUCTION FOR 1ST SIMULATION PROCESSOR |
| FFF 1 | HALT INSTRUCTION FOR 2ND SIMULATION PROCESSOR |
| FFF 2 | HALT INSTRUCTION FOR 3RD SIMULATION PROCESSOR |
| FFF 3 | HALT INSTRUCTION FOR 4TH SIMULATION PROCESSOR |
| FFF 4 | HALT INSTRUCTION FOR 5TH SIMULATION PROCESSOR |
| FFF 5 | HALT INSTRUCTION FOR 6TH SIMULATION PROCESSOR |
| FFF 6 | HALT INSTRUCTION FOR 7TH SIMULATION PROCESSOR |
| FFF 7 | HALT INSTRUCTION FOR 8TH SIMULATION PROCESSOR |
| FFF 8 | HALT INSTRUCTION FOR 9TH SIMULATION PROCESSOR |
| FFF 9 | HALT INSTRUCTION FOR 10TH SIMULATION PROCESSOR |
| FFF A | HALT INSTRUCTION FOR 11TH SIMULATION PROCESSOR |
| FFF B | HALT INSTRUCTION FOR 12TH SIMULATION PROCESSOR |
| FFF C | HALT INSTRUCTION FOR 13TH SIMULATION PROCESSOR |
| FFF D | HALT INSTRUCTION FOR 14TH SIMULATION PROCESSOR |
| FFF E | HALT INSTRUCTION FOR 15TH SIMULATION PROCESSOR |
| FFF F | HALT INSTRUCTION FOR 16TH SIMULATION PROCESSOR |

FIG. 9B

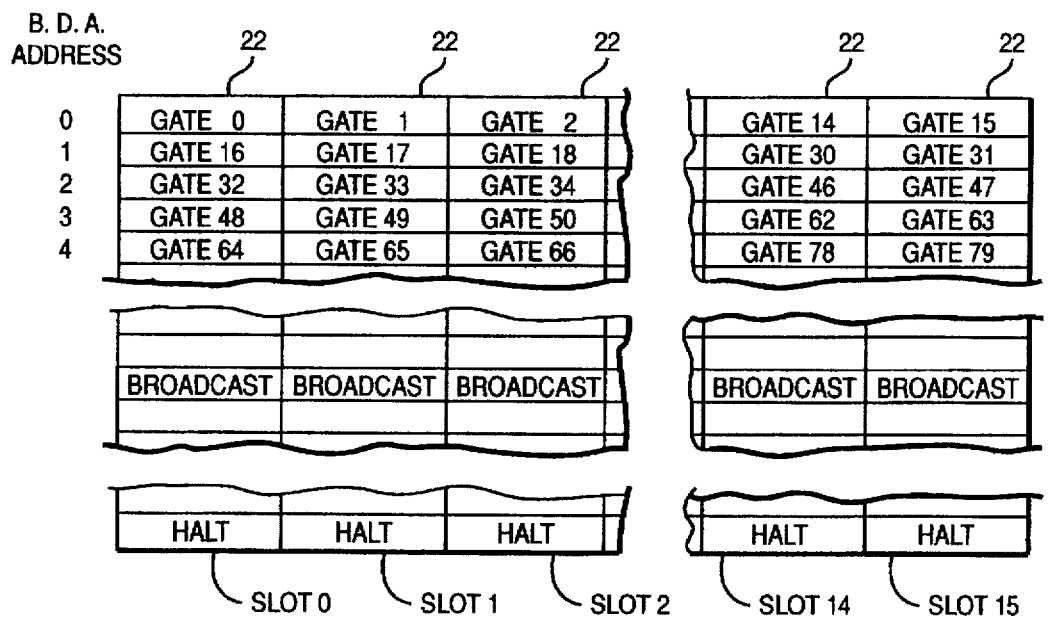

FIG. 10

| CYCLE | DATA LINES 3B | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| 0 | P1 (G) | P2 (G) | P3 (G) | P4 (G) | P5 (G) | P6 (G) | P7 (G) | P8 (G) | P9 (G) | P10 (G) | P11 (G) | P12 (G) | P13 (G) | P14 (G) | P15 (G) | P16 (G) |
| 1 | P1 (G) | P2 (G) | P3 (G) | P4 (G) | P5 (G) | P6 (G) | P7 (G) | P8 (G) | P9 (G) | P10 (G) | P11 (G) | P12 (G) | P13 (G) | P14 (G) | P15 (G) | P16 (G) |
| 2 | PROCESSOR 1 (BROADCAST) | PROCESSOR 2 (BROADCAST) | PROCESSOR 3 (BROADCAST) | PROCESSOR 4 (BROADCAST) |
| | PROCESSOR 5 (BROADCAST) | PROCESSOR 6 (BROADCAST) | PROCESSOR 7 (BROADCAST) | PROCESSOR 8 (BROADCAST) |
| | PROCESSOR 9 (BROADCAST) | PROCESSOR 10 (BROADCAST) | PROCESSOR 11 (BROADCAST) | PROCESSOR 12 (BROADCAST) |
| | PROCESSOR 13 (BROADCAST) | PROCESSOR 14 (BROADCAST) | PROCESSOR 15 (BROADCAST) | PROCESSOR 16 (BROADCAST) |

FIG. 16

INTERFACE FOR LOGIC SIMULATION USING PARALLEL BUS FOR CONCURRENT TRANSFERS AND HAVING FIFO BUFFERS FOR SENDING DATA TO RECEIVING UNITS WHEN READY

This application is a continuation of application Ser. No. 08/091,521, filed on Jul. 14, 1993, now U.S. Pat. No. 5,548,785 which is a continuation of application Ser. No. 07/502,147, filed on Mar. 30, 1990, now abandoned.

RELATED PATENT APPLICATIONS

U.S. Pat. No. 5,327,361, issuing Jul. 5, 1994, originally filed Mar. 30, 1990, and entitled "All Events Trace Gatherer for a Logic Simulation Machine". Co-pending application U.S. Ser. No. 08/018,678, originally filed Mar. 30, 1990, and entitled "Broadcast Command for a Logic Simulation Machine" now abandoned. Co-pending application U.S. Ser. No. 08/007,378, originally filed Mar. 30, 1990, and entitled "Method and Apparatus for Multiprocessor Logic Simulation with Parallel Data Transfer", now abandoned. All of them are assigned to the same assignee as the present application.

1. Technical Field

The present invention relates to a logic simulation machine for the simulation of digital logic, and in particular, to a host interface of the logic simulation machine for connecting the logic simulation machine to a host computer with a First-In First-Out buffer.

2. Background of the Invention

Logic technologies such as very large scale integrated circuits provide significant improvements in cost/performance and reliability. However, they have disadvantages in that their fault diagnosis is more difficult than previous technologies and their engineering rework cycles needed to correct faults in logic design are greatly lengthened. These disadvantages exact great economic penalties for design errors and omissions and place a great emphasis on the goal of completely verifying designs in advance of engineering models.

One technique for providing design verification is logic simulation by a general purpose computer. Another technique is to use a special purpose computer that is optimized for logic simulation. The special purpose computer usually uses a multiple processor architecture by which a number of processors, called simulation processors, may be interconnected to improve simulation performance. The special purpose computer may operate in combination with a host computer which is used to provide several services, for example, loading functions, memory modeling, analysis on the results of the simulation, user interface, etc. Such a special purpose computer is called a logic simulation machine. The invention relates to a host interface of the logic simulation machine for connecting the logic simulation machine to the host computer.

The prior art logic simulation machine is described in U.S. Pat. No. 4,306,286 issued Dec. 15, 1981, to Cocke et al. and assigned in common with the present application. The logic simulation machine of the Cocke et al. patent comprises a plurality of parallel basic processors which are interconnected through an inter-processor switch. The inter-processor switch provides communication not only among the basic processors which are computing engines of the logic simulation machine, each simulating the individual gates of a portion of a logic model in parallel, but also between them and a control processor which provides overall control and input/output facilities of the logic simulation machine through a host computer to which the control processor is attached. Each basic processor contains the current state information for only the set of gates that is being simulated by that processor. When a basic processor simulates a gate whose input includes a connection to the output of a gate being simulated by a different processor, the state information for the gate in question is transferred over the inter-processor switch.

The host computer provides the logic simulation machine with several services, loading function, memory modeling, analysis on the results of the simulation, user interface, etc. In order to provide such services, communication between the host and the logic simulation machine needs to be established. The communication, however, causes delays in the simulation due to host-machine interaction when the communication is established during the simulation. Namely, the logic simulation machine is required to stop during host interactions, slowing down the net simulation throughput. There is no teaching in the Cocks et al patent directed to the utilizing First-In First-Out buffers for the interface between the host and the logic simulation machine to minimize the delays.

DISCLOSURE OF THE INVENTION

Accordingly, it is the primary object of the present invention to provide a host interface for a logic simulation machine to connect the logic simulation machine to a host computer for transferring data between them.

It is another object of the invention to provide a host interface for a logic simulation machine to minimize delays in the simulation due to host interaction with the logic simulation machine during communication between them.

Also, it is an object of the invention to provide a host interface for a logic simulation machine to decouple the logic simulation machine and the host computer to allow the logic simulation machine and the host computer to overlap their functions without requiring to wait until communication completion between them.

In accordance with these and other objects of the present invention, there is provided a host interface for a logic simulation machine for transferring data between the logic simulation machine and the host computer. The host interface comprises a First-In First-Out buffer provided between the logic simulation machine and the host computer, and a control means for controlling the First-In First-Out buffer so that the First-In First-Out buffer temporarily stores data being transferred until a receiver of the data is ready to receive the data.

BRIEF DESCRIPTION OF THE DRAWING

For a more complete understanding of the present invention and further objects and advantages thereof, reference is now made to the following Description of the Preferred Embodiment taken in conjunction with the accompanying Drawings, in which:

FIG. 3 is a schematic diagram showing contents of a block description array of the simulation processor of FIG. 2.

FIG. 4 is a schematic diagram showing the op-code field of instructions stored in the block description array of FIG. 3.

FIG. 5 is a schematic block diagram of a simplified logic circuit model used in explaining a block description instruction and operation of the simulation processor shown in FIG. 2.

FIG. 9A and 9B are an instruction list to explain a method of compiling a model to be simulated by the machine of FIG. 1.

FIG. 10 is a simplified illustration of the block description arrays of the simulation processors in the machine of FIG. 1 to explain operation of the machine.

FIG. 16 is a schematic diagram to explain how the logic simulation machine of FIG. 1 puts data on the simulation bus means during gate evaluation and Broadcast operation.

BEST MODE FOR CARRYING OUT THE INVENTION

Figure 1A:
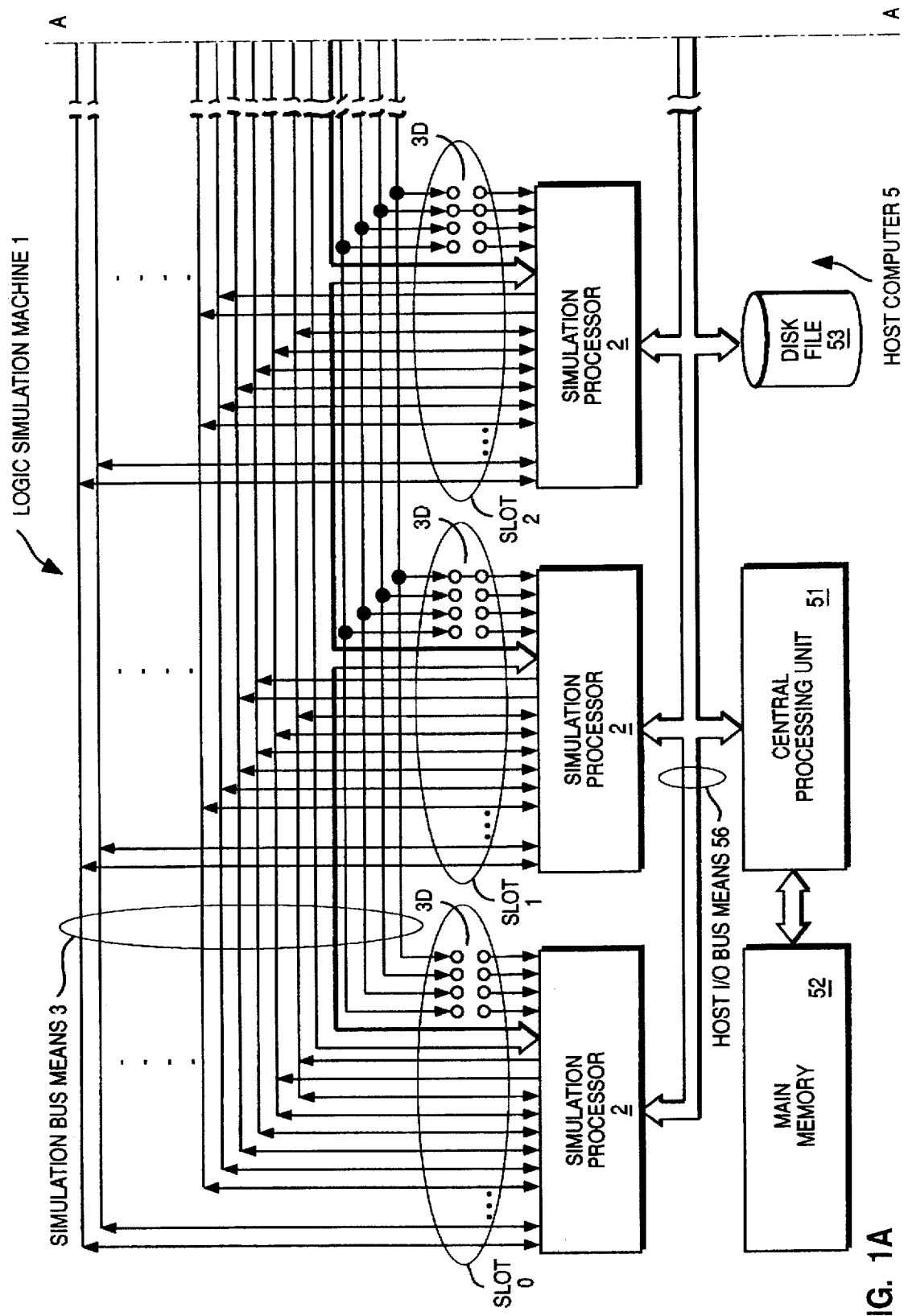
FIG. 1A and 1B are an entire schematic block diagram of a logic simulation machine in which a host interface for a logic simulation machine according to a preferred embodiment of the invention is used.
Figure 1B:
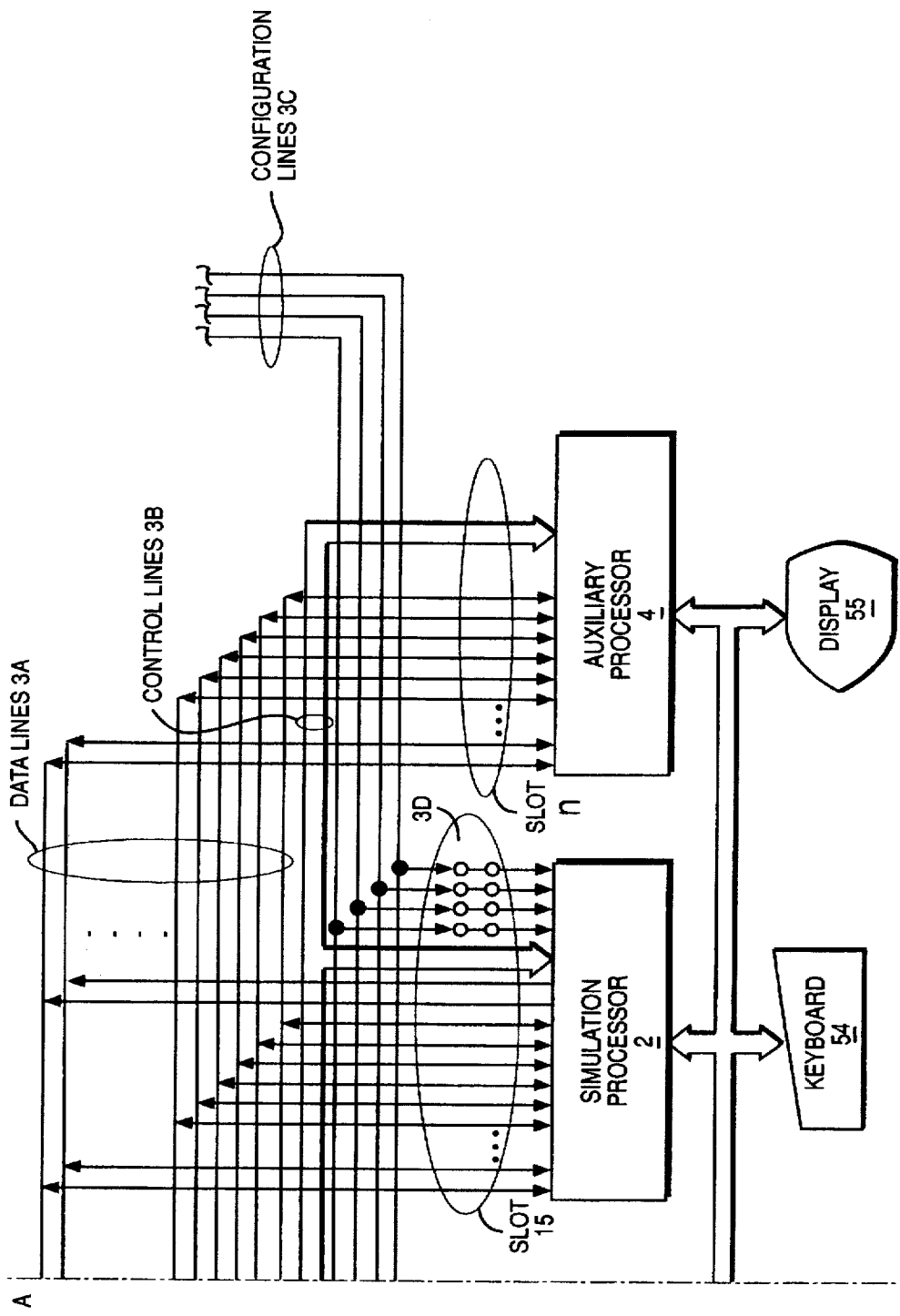

Referring to the block diagram of FIG. 1, a logic simulation machine 1 in which a host interface according to a preferred embodiment of the invention is used is explained. The logic simulation machine 1 is the subject of the co-pending application U.S. Ser. No. 08/007,378, and originally filed Mar. 30, 1990, now abandoned. The machine 1 includes plural simulation processors 2 connected to each other in parallel through a simulation bus means 3. Although four simulation processors 2 are shown in FIG. 1, the number of the simulation processors 2 connected to the simulation bus means 3 is sixteen and sixteen processors are a maximum configuration in this example for explanation purpose. However, any number of simulation processors selected from a group consisting of 1, 2, 4, 8, and 16 is able to be used in the machine 1.

The simulation bus means 3 comprises three parts: data lines 3A through which each simulation processor 2 transfers a simulated result and each simulation processor 2 receives the results from all the simulation processors 2 to update its own copy of current states when evaluating gates, through which a host computer 5 transfers packet data to the simulation processors 2 when not evaluating gates, and through which the simulation processors 2 transfer any packet data to the host 5 by Broadcast commands; control lines 3B through which current contents on the data lines 3A are indicated and arbitration for the bus 3 is done; and configuration lines 3C through which a unique code is transferred to each of the simulation processors 2 to inform the configuration of the simulation processors. The simulation bus means 3 further comprises slot means 0, 1, 2, . . . , 15 and n. Each simulation processor 2 is plugged into the slot means 0, 1, 2, . . . , or 15 for connection with the simulation bus means 3. Each slot means 0, 1, 2, . . . , or 15 of the simulation bus means 3 has a hard wired means 3D associated with the configuration lines 3C. The number of the configuration lines 3C depends on how many simulation processors 2 the logic simulation machine 1 can contain. In this embodiment, the number of the lines 3C is four to convey a different 4-bit binary data to each of the sixteen simulation processors. The hard wired means 3D of the slot means 0 sets all the lines of the configuration lines 3C OFF so that the configuration lines 3C input 4-bit binary zero data 0000 into the simulation processor 2 plugged into the slot means 0. The hard wired means 3D of the slot means i sets the least significant bit line ON and the other three lines OFF so that the configuration lines 3C input binary data 0001 into the simulation processor 2 plugged into that slot means. The hard wired means 3D of the slot means 2 sets the second least significant bit line ON and the other three lines OFF so that the configuration lines 3C input binary data 0010 into the simulation processor 2 plugged into that slot means and so on. The hard wired means 3D of the slot means 15 sets all the lines ON so that the configuration lines 3C input binary data 1111 into the simulation processor 2 plugged into that slot means.

An auxiliary processor 4 which executes some tasks, for example, memory modeling or trace collection which is the subject of the U.S. Pat. No. 5,327,361, issuing Jul. 5, 1984, and originally filed Mar. 30, 1990; and instead of the host computer 5 may be plugged into the slot means n of the bus means 3 for connection with the simulation bus means 3 in parallel with the simulation processors 2.

The number of the data lines 3A depends on how many simulation processors 2 the logic simulation machine 1 can contain and how many bits each simulation processor 2 needs to represent a calculated result. In this example, the machine 1 can contain up to sixteen simulation processors 2 and each simulation processor 2 calculates a 2-bit result. Therefore, the number of the data lines 3A is 16×2=32. Each of the simulation processors 2 is allocated two data lines 3A to transfer a result calculated by that processor to all of the simulation processors 2, depending upon which slot means that processor 2 occupies as explained later. The data lines 3A can be used by the host computer 5 to load data and instructions into each of the simulation processors 2 and the auxiliary processor 4 before simulation and also be used by the machine 1 to send the data stored in the simulation processors 2 to the host 5 and the auxiliary processor 4 during the simulation as explained later.

The host computer 5 may be a conventional engineering workstation. The host computer 5 includes a central processing unit 51, a main memory 52, a disk file (direct access storage device) 53, a keyboard a display 55, and a host I/O bus means 56. Each of the simulation processors 2 and the auxiliary processor are connected to the host computer 5 through the I/O bus means 56 by being plugged into slot means (not shown) of the I/O bus means 36. If the number of the simulation processors 2 exceeds the number of the I/O slot means provided within the host computer 5, an extension housing may be used to connect the additional simulation processors to the host computer 5.

The simulation processors 2 and the auxiliary processor 4 are provided on rectangular cards. Connector (not shown) for the slot (not shown) of the host I/O bus means 56 is provided at one end of the card on which the simulation processor 2 or the auxiliary processor 4 is mounted. Connector (not shown) for the slot means 0, 1, . . . , 15 or n of the simulation bus means 3 is provided at the opposite end of the card. The simulation processors 2 and the auxiliary processor 4 are installed in the host 5 by directly plugging the connector (not shown) at the one end of the card into the slot (not shown) of the host I/O bus 56. The simulation bus means 3 connects the simulation processors 2 and the auxiliary processor 4 by plugging the slot means 0 thru n into the connectors (not shown) at the opposite end of the cards.

Figure 2:
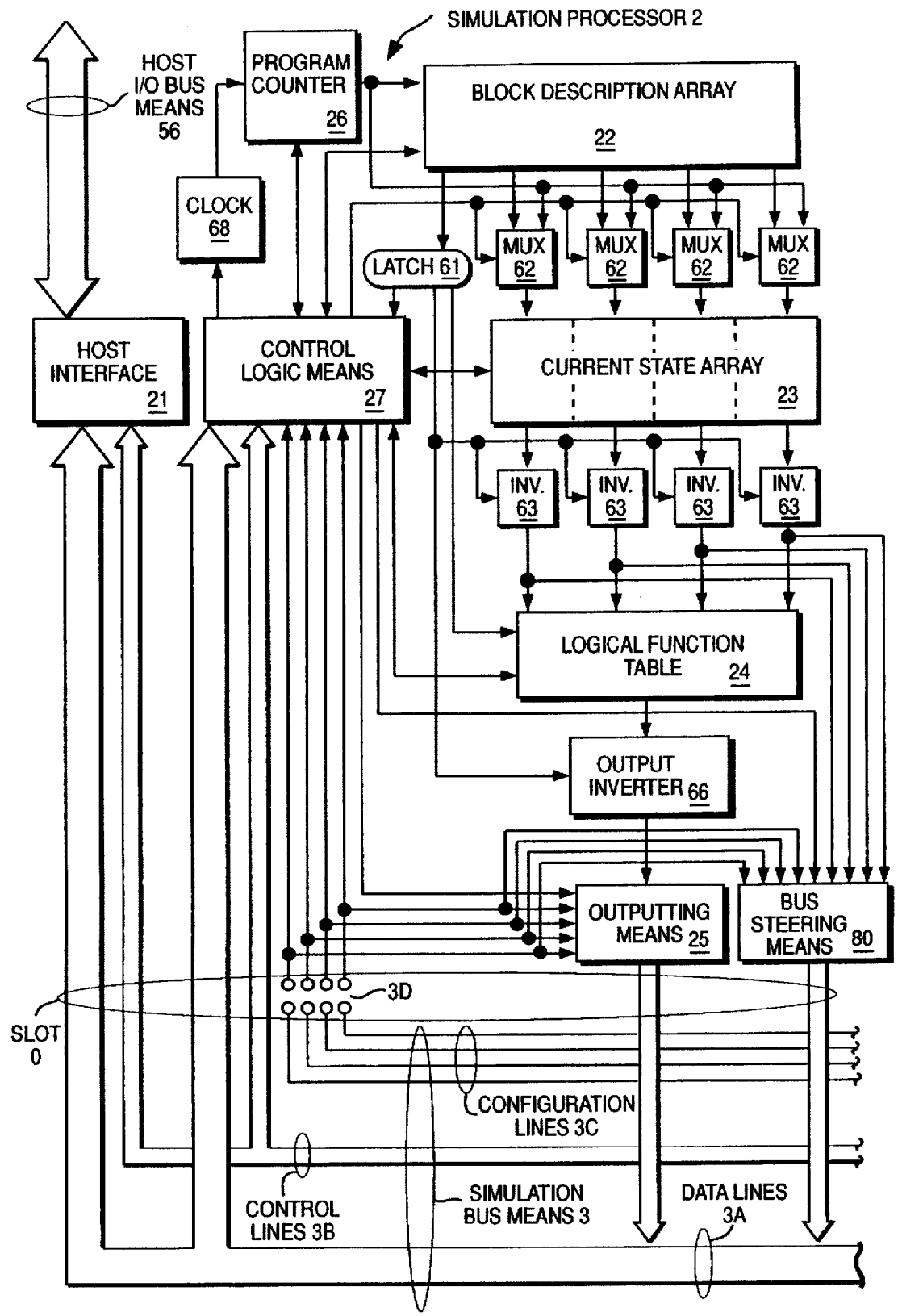
FIG. 2 is a schematic block diagram of the simulation processor plugged into the slot 0 in FIG. 1.

Now, referring to FIG. 2, the structure of the simulation processor 2, plugged into the slot means 0 of the simulation bus means 3 is explained. The other simulation processors 2 have the same structure except a host interface 21. Each simulation processor 2 has seven primary elements: a first memory unit, such as a block description array 22; a second memory unit, such as a current state array 23; a logical function table 24; an outputting means 25; a bus steering means 80; a program counter 26 and a control logic means 27.

The block description array 22 is an instruction memory for the simulation processor 2 which contains all of the information necessary to specify operations of that processor. FIG. 3 shows contents of the block description array 22. An instruction stored at one address in the array 22 contains an op-code field (16 bits), A1, A2, A3, and A4 fields (each 24 bits in this embodiment). There are two kinds of instructions determined by the op-code field as shown in FIG. 4, that is, a block description instruction having a binary one at a first bit position of the op-code field for evaluating a gate and a control instruction having a binary zero at the first bit position of the op-code field for controlling operation of that simulation processor.

As to the block description instruction, one instruction word corresponds to each logical block or gate in a model to be simulated. The instruction word's address represents a block or gate identifier. The instruction contains the op-code field, to specify a logical function of the gate, such as AND, OR, etc., and four fields A1, A2, A3 and A4, to specify input connections or input operands of the gate. Thus, a block description instruction corresponds to a single 1-output, 4-input gate. The logical function of the gate is determined by an 8-bit function pointer FFFFFFFF in the op-code which is an index to the logical function table 24. Input/output inversion can be done independent of the logical function table 24 by inversion bits I1, I2, I3, I4, and I0 in the op-code. The fields A1, A2, A3, and A4 represent addresses in the current state array 23 where the four input operands are stored. The block description instruction's address in the block description array 22 implies its output address in the current state array 23 where the calculated result is to be stored. The size of the block description array 22 depends on a desired capacity of the machine 1. In this example, the array 22 can store up to 512K block description instructions.

FIG. 5 shows an example of a gate to be simulated by the simulation processor 2 in order to illustrate the block description instruction shown at an address Z in FIG. 3. An AND gates is identified by a numeral Z which corresponds to an address in the block description array 22 where the block description instruction of the gate is stored. The AND function pointer and the inversion functions of the gate are stored in the op-code field of the instruction. Input connections V, W, X, and Y of this gate are stored in the fields A1, A2, A3 and A4 of the instruction. The current state array 23 stores the input operands of the gate Z at addresses V, W, X, and Y designated by the fields A1, A2, A3, and A4.

Figure 12:
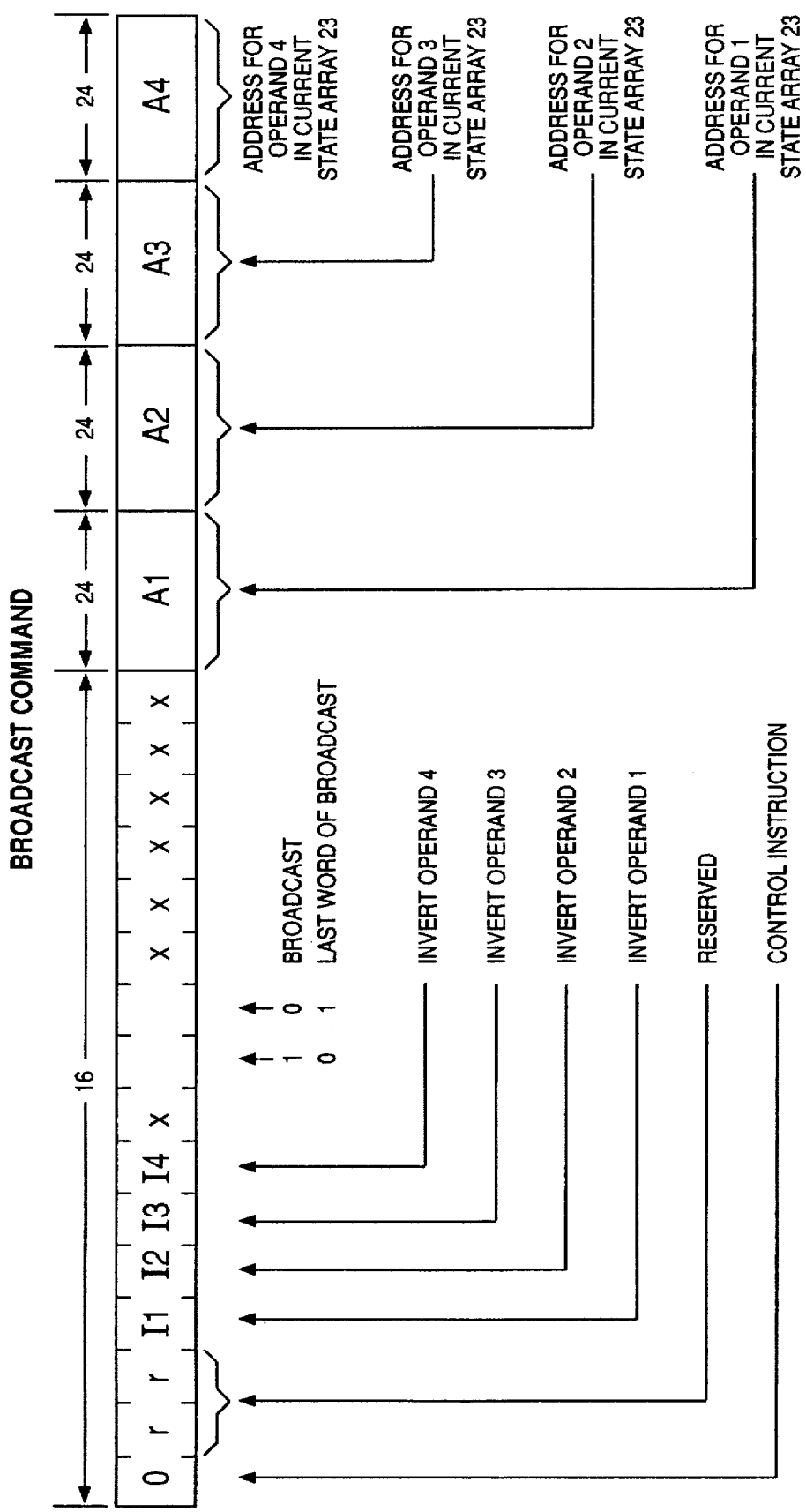
FIG. 12 is a schematic diagram to explain a Broadcast command to be used for sending data from the logic simulation machine to a host computer.

As to control instructions, as shown in FIG. 4, the op-code field specifies a control function executed by the simulation processors. Halt means to stop the simulation to wait for host interaction. Branch means to go to an instruction stored in the address designated by the fields A2 and A3. Broadcast means to send any packet of data to the simulation bus means 3 for use by the host 5 or the auxiliary processor 4. There are two kinds of Broadcast commands, one of which indicates Broadcast and the other of which indicates Broadcast End. FIG. 12 shows the Broadcast commands in detail. The Broadcast commands contain inversion bits I1, I2, I3, and I4 in the op-code field to invert operands fetched from the current state array 23 before sending to the host 5. The fields A1 thru A4 contain addresses of the operands to be fetched from the current state array 23. The Broadcast command is the subject of the co-pending application U.S. Ser. No. 08/018,678, and originally filed Mar. 30, 1990 now abandoned.

Figure 6:
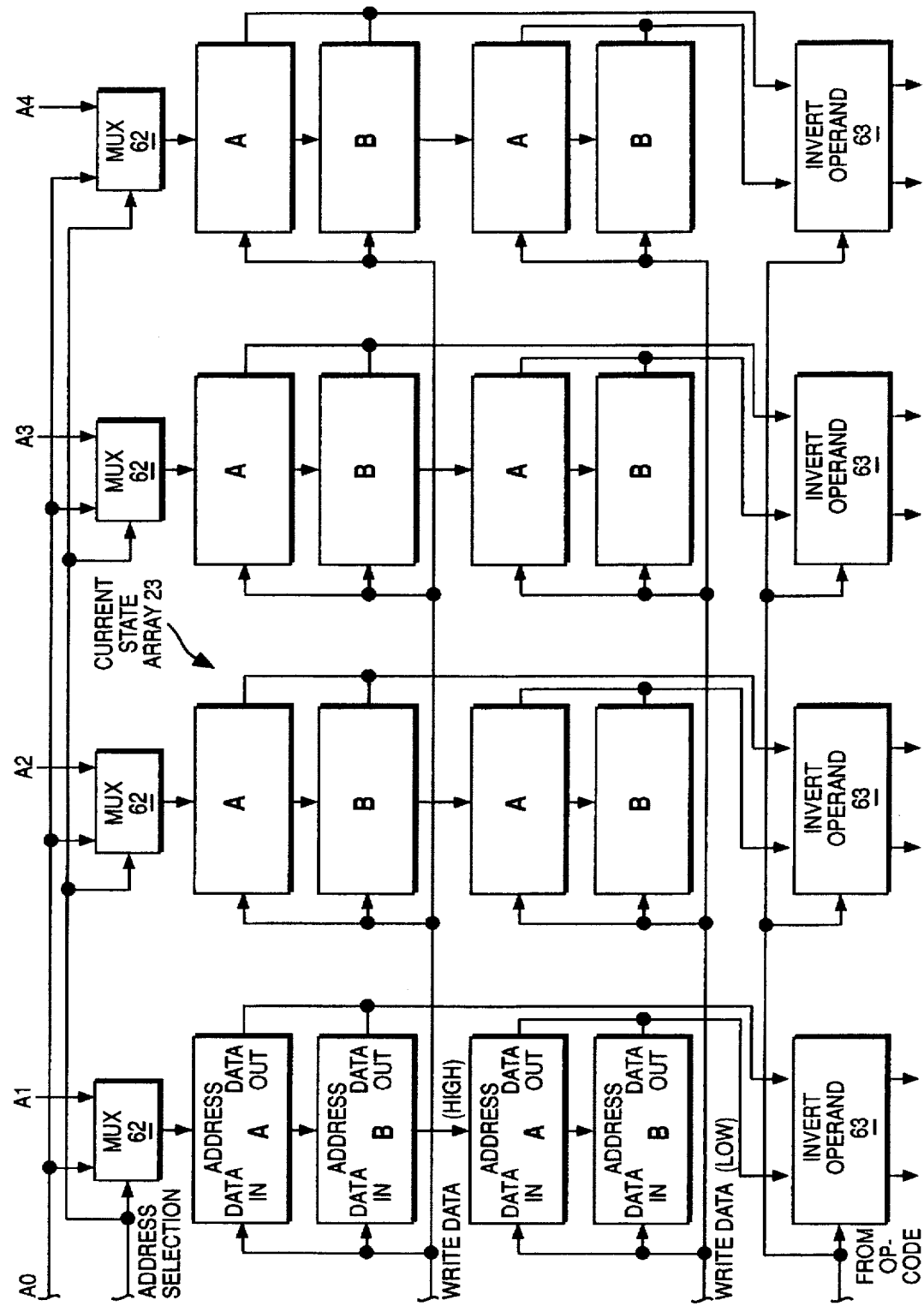
FIG. 6 is a schematic block diagram of a current state array of the simulation processor of FIG. 2.

Referring to FIG. 6, the current state array 23 is explained. The current state array 23 is a memory which stores a complete copy of current states of a whole model being simulated. The state of each block or gate is specified by 2 bits. The possible states are logical 0 (00), logical 1 (01), Undefined (10) and High Impedance (11). The current state array 23 stores such current states of all blocks or gates of the machine being simulated. There are 512K possible blocks or gates in the machine being simulated in this example, so the state of the machine being simulated is contained in 1M bits. The current state array 23 must have 1M bit capacity at least. In this example, however, the current state array 23 is larger to achieve maximum performance. In the computation for a given gate or in the Broadcast operation by the Broadcast command, the contents of the current state array 23 are simultaneously addressed by the four fields A1, A2, A3 and A4. It is preferred to read the current states of four different blocks or gates simultaneously. Therefore, the array 23 is replicated 4 times. When reading the array 23, four different addresses can be read simultaneously. When writing the array 23, the same addresses in all four arrays are always written. That is, when the current state array 23 is read, the multiplexors 62 are controlled through an address selection by the control logic means 27 to output addresses A1, A2, A3, and A4 to each array. Than, each array outputs a 2-bit operand to an operand invert logic means 63. Each of the outputted operands may be inverted by the inversion bit of the op-code in the means 63 before the calculation in the logical function table 24 or being sent to the host 5. When the current state array 23 is written, the multiplexors 62 are controlled through the address selection by the control logic means 27 to output one address AO. Then, the same data is written into the four arrays at the same address AO. Of course, this could been done using a single array and time-slicing, but at the expense of roughly 4 times performance. Furthermore, another 4 arrays are added in the example shown in FIG. 6. For unit delay simulation, the state of the machine being simulated needs to be saved in a "master-slave" arrangement. That is, the complete next state of the machine needs to be computed before this becomes the current state of the machine. The simplest way to implement this is with two memory (A and B) operating in a ping-pong arrangement. When A contains the current state, B will be used to save the next state. When B contains the current state, A is used to save the next state.

Figure 7:
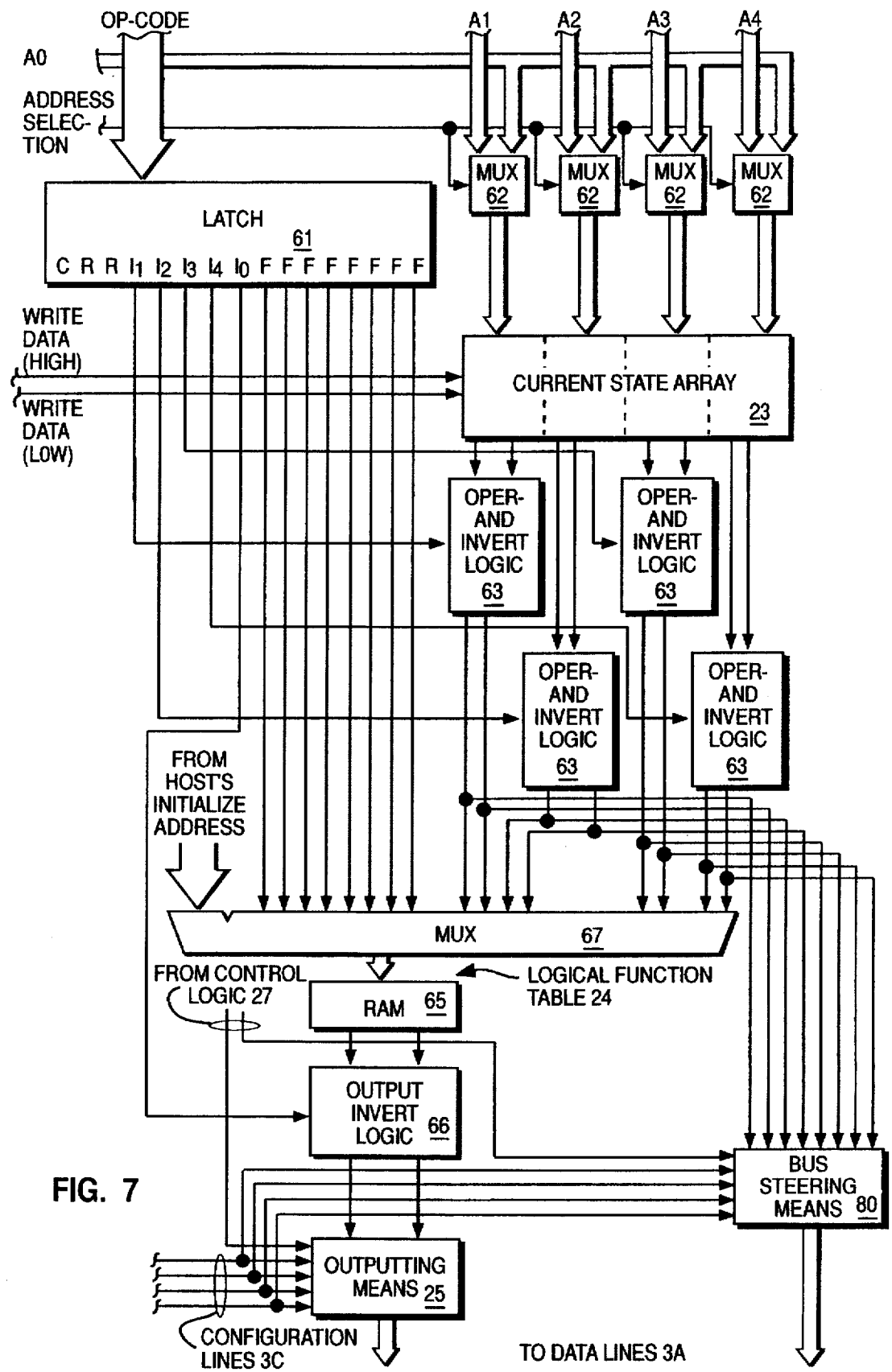
FIG. 7 is a detailed schematic block diagram of a part of the simulation processor of FIG. 2.

Referring to FIG. 7, the logical function table 24 is explained. The logical function table 24 is a programmable logic block whose main element is a memory 65, a 64K×2 bit static RAM, indexed by the 8-bit function pointer in the op-code field plus the four 2-bit input operands form the operand invert logic 63. The logical function table 24 generates a 2-bit output, which is the next state of the gate being evaluated. The RAM 65 is also accessible to the host computer 5 through a multiplexor 67, which needs to load it with a set of logical functions prior to beginning of the simulation. The logical function table 24 is in essence a look up table which generates a 2-bit output with respect to a given gate function and four input operands. The output of the logic function table 24 is supplied to the outputting means 25 through an output invert logic means 66. The output from the table 24 may be inverted in the output invert logic means 66 by the inversion bit of the op-code before being put on the allocated lines of the data lines 3A through the outputting means 25.

The outputs from the operand invert logics 63 are also supplied to the bus steering means 80. When the Broadcast command is executed by the control logic the bus steering means 80 receives four current states designated by A1 thru A4 fields of the command from the current state array 23 through the operand invert logics 63 and puts the data on the data lines 0 thru 7, 8 thru 15, 16 thru 23, or 24 thru 31 under the control of the control logic 27. In this way, the data in the current state array 27 are sent to the host 5 by the Broadcast command from the simulation processors 2.

Figure 8:
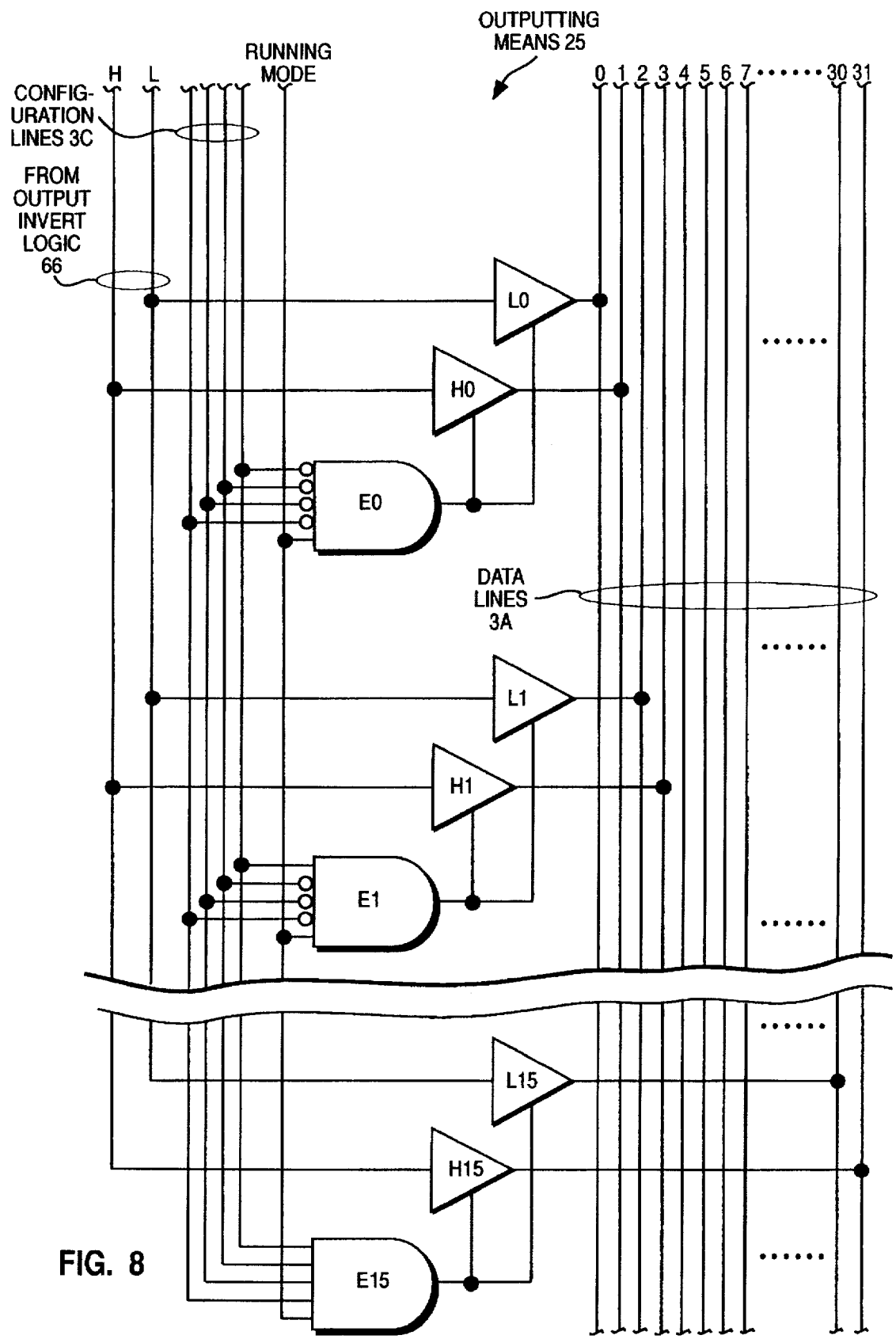
FIG. 8 is a schematic block diagram of an outputting means of the simulation processor of FIG. 2 for putting a result from a logic function table on allocated data lines of the simulation bus.

Referring to FIG. 8, the outputting means 25 is explained. The outputting means 25 comprises 16 AND gates E0, E1, ..., and E15, 16 gates L0, L1, ..., and L15 whose outputs are connected to the even number lines 0, 2, ..., and 30 of the data lines 3A, respectively, and 16 gates H0, H1, ..., and H15 whose outputs are connected to the odd number lines 1, 3, ..., and 31 of the data lines 3A, respectively. Configuration lines 3C which are connected to the hard wired means 3D and the control logic 27 are connected to inputs of the AND gates E0, E1, ..., and E15. All the inputs from the lines 3C to the gate E0 are inverted so that only the 4-bit binary data 0000 on the lines 3C can the gate E0. An input from the least significant bit line of the lines 3C is directly connected to the gate E1 end the other three inputs from the lines 3C to the gate E1 are inverted so that only the 4-bit binary data 0001 can activate the gate E1 and so on. All the inputs from the lines 3C are directly connected to the gate E15 so that only the 4-bit binary data 1111 on the lines 3C can activate the gate E15. A running mode signal from the control logic 27 is also connected to an input of each of the AND gates E0, E1, ..., and E15 to activate the AND gates during running mode of the simulation processors 2. Outputs of the AND gates E0, E1, ..., and E15 are connected to enable terminals of the gates L0 and H0, L1 and H1, ..., and L15 and H15, respectively. The low bit line of the output from the output invert logic means 66 is connected to inputs of the gates L0, L1, ..., and L15. The high bit line of the output from the output invert logic means 66 is connected to inputs of the gates H0, H1, ..., and H15. Accordingly, the simulation processors 2 plugged into the slot means 0, 1, 2, ..., and 15 put their calculated results on the lines 0 and 1, lines 2 and 3, lines 4 and 5, ..., and lines 30 and 31 of the data lines 3A through the outputting means 25, respectively. Thus, each simulation processor 2 is allocated two of the data lines 3A to put its result thereon, depending on which slot means of the simulation bus 3 that processor 2 occupies.

Figure 13:
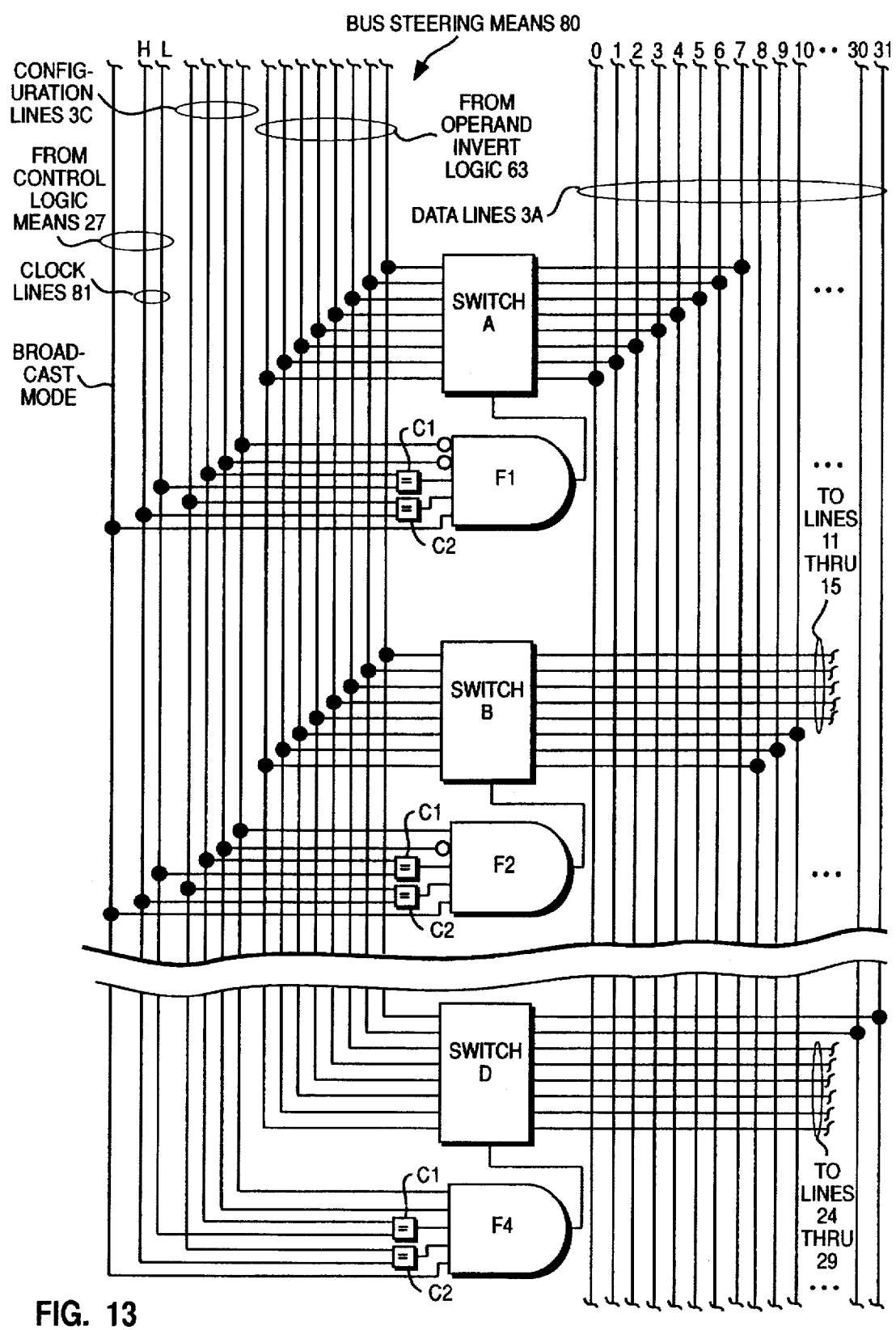
FIG. 13 is a schematic block diagram of a bus steering means which is used by the Broadcast command to put data from the simulation processors on the simulation bus means to send to the host computer.

Referring to FIG. 13, the bus steering means 80 is explained. The bus steering means 80 is used by the Broadcast command to put the data on the data lines 3A from the current state array 23 to send to the host 5. The means 80 includes four switches A, B, C(not shown), and D which connect the 8-bit data from the four operand invert logics 63 to the data lines 0 thru 7, 8 thru 15, 16 thru 23, and 24 thru 31, respectively. When AND gates F1, F2, F3(not shown), and F4 output logical one signal to enable terminals of the switches A, B, C, and D, the switches put the 8-bit data from the four logics 63 on the allocated data lines 0 thru 7, 8 thru 15, 16 thru 23, and 24 thru 31 in parallel. The gates F1, F2, F3, and F4 receive inputs from the least and the second least significant bit lines of the configuration lines 3C which are connected to the hard wired means 3D and the control logic means 27. The inputs to the gate F1 from the lines 3C are all inverted. The least significant bit line of the lines 3C is directly connected to the gate F2 and the second significant bit line of the lines 3C is inverted before inputting into the gate F2. Input of the least significant bit line of the lines 3C is inverted before being inputted into the gate F3 (not shown) and the second least significant bit line of the lines 3C is directly connected to the input of the gate F3 (not shown). The inputs of the lines 3C are directly connected to the gate F4. The gates F1, F2, F3 and F4 also receive inputs from comparators C1 and C2. The comparator C1 outputs logical one signal when the second most significant line of the configuration lines 3C and a low line L of clock lines 81 from the control logic means 27 have the same binary signal thereon. The comparator C2 outputs logical one signal when the most significant bit line of the lines 3C and a high clock line H of the clock lines 81 have the same binary signal thereon. The control logic means 27 sends clock signals (0,0), (0,1), (1,0) and (1,1) through the clock lines 81 in this order during Broadcast operation when there are sixteen processors 2 connected to the simulation bus means 3. The control logic means 27 sends clock signals (0,0) and (0,1) through the clock lines 81 alternately during the Broadcast operation when there are eight processors 2 connected to the bus 3. The control logic means 27 keeps the clock signal (0,0) on the clock lines 81 during the Broadcast operation when four, two or one processor 2 is connected to the bus 3. The gates F1, F2, F3, and F4 also receive an input indicating Broadcast mode during the Broadcast operation from the control logic means 27.

Referring back to FIG. 2, the control logic means 27 controls a clock means 68 so that all the simulation processors 2 connected with the simulation bus means 3 synchronously execute their operations. The control logic means 27 controls the program counter 26 so that the program counter 26 generates addresses to output instructions from the block description array 22 and addresses to write the calculated results from all of the simulation processors 2 into the current state arrays 23. The control logic means 27 controls the control instructions, such as Branch, Broadcast, and Halt. The control logic means 27 also controls the simulation processor 2 to load the block description array 22 with instructions and the current state array 23 with initial states from the host computer 5 before simulation.

In addition, the simulation processor 2 occupying the slot 0 contains the host interface 21 of the invention to transfer data and instructions between the host 5 and the simulation processors 2. The host interface 21 contains First-In First- Out buffers to buffer data between the simulation bus means 3 and the host I/O bus means 56. When packet data comes from the host through the host interface 21, each of the simulation processors 2 takes its data off the simulation bus means 3. When packet data are sent to the host, control logic in the host interface 21 determines, by the contents of the control lines 3B, that the data on the data lines 3A is intended for the host and transfers the data to the host 5. The host interface means 21 allows the user to initialize the block description array 22 and the current state arrays 23 at the beginning of the simulation and tests results at the end of the simulation. It also allows the user to receive by Broadcast commands from the simulation processors, and modify the contents of the current state arrays 23 during the simulation for enhanced simulation capability.

Figure 14:
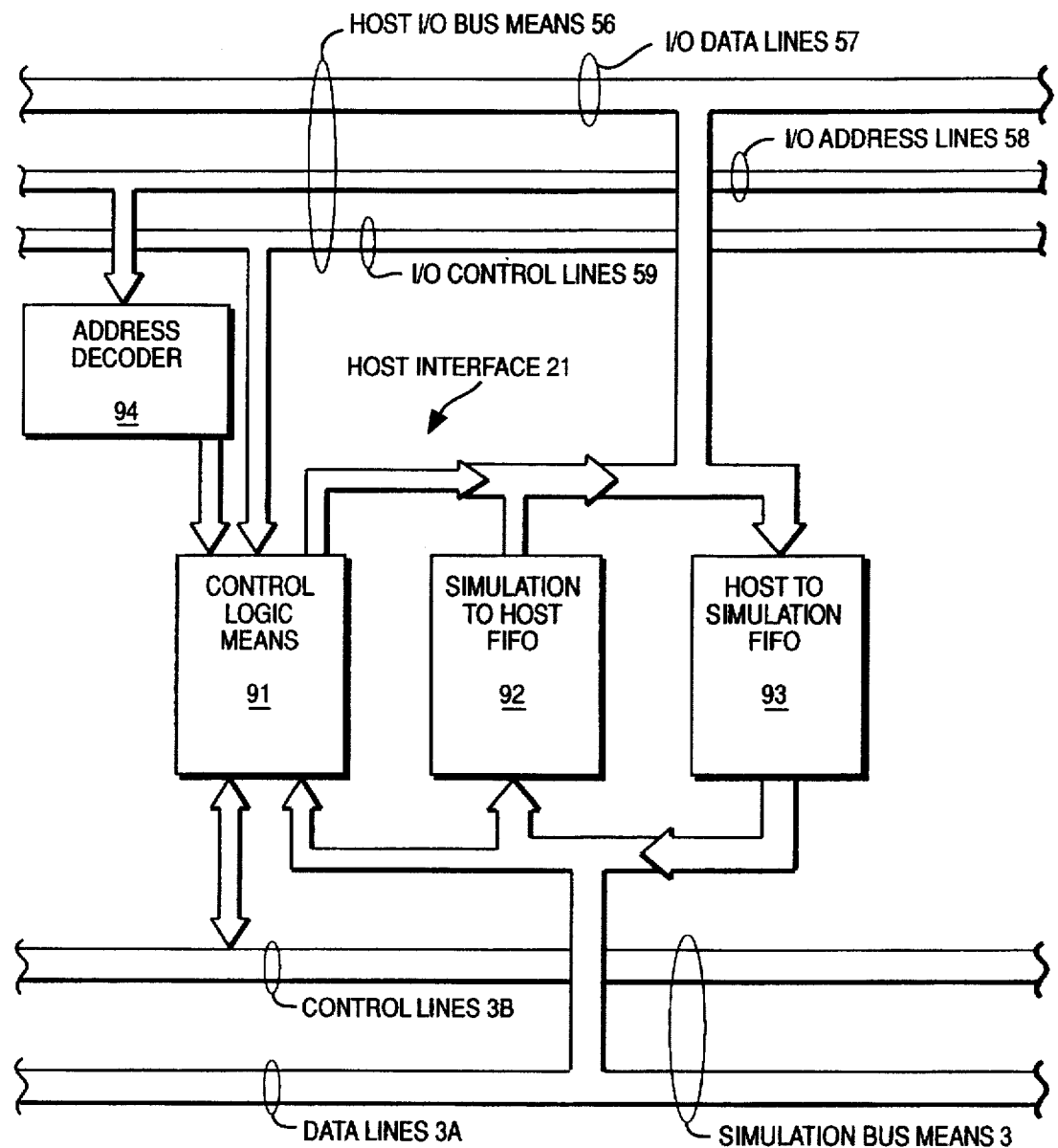
FIG. 14 is a schematic block diagram of a host interface for the logic simulation machine of FIG. 1 according to a preferred embodiment of the invention.

Referring to FIG. 14, the host interface 21 is explained. The host interface 21 includes a control logic means 91, a simulation to host FIFO buffer 92, a host to simulation FIFO buffer 93, and an address decoder 94. The simulation to host FIFO 92 receives and temporarily stores data from the data lines 3A of the simulation bus means 3 to send the data to the I/O data lines 57. The host to simulation FIFO 93 receives and temporarily stores data from the I/O data lines 57 to send the data to the data lines 3A of the simulation bus 3. The address decoder 94 receives an address from the I/O address lines 58. The control logic means 91 receives control signal from the control lines 3B of the simulation bus means 3 and the I/O control lines 59 of the I/O bus 56 and also receives header of packet to be sent from the simulation processors 2 to the host 5. The control means 91 also sends status information to the host 5 through the data lines 57.

Figure 15A:
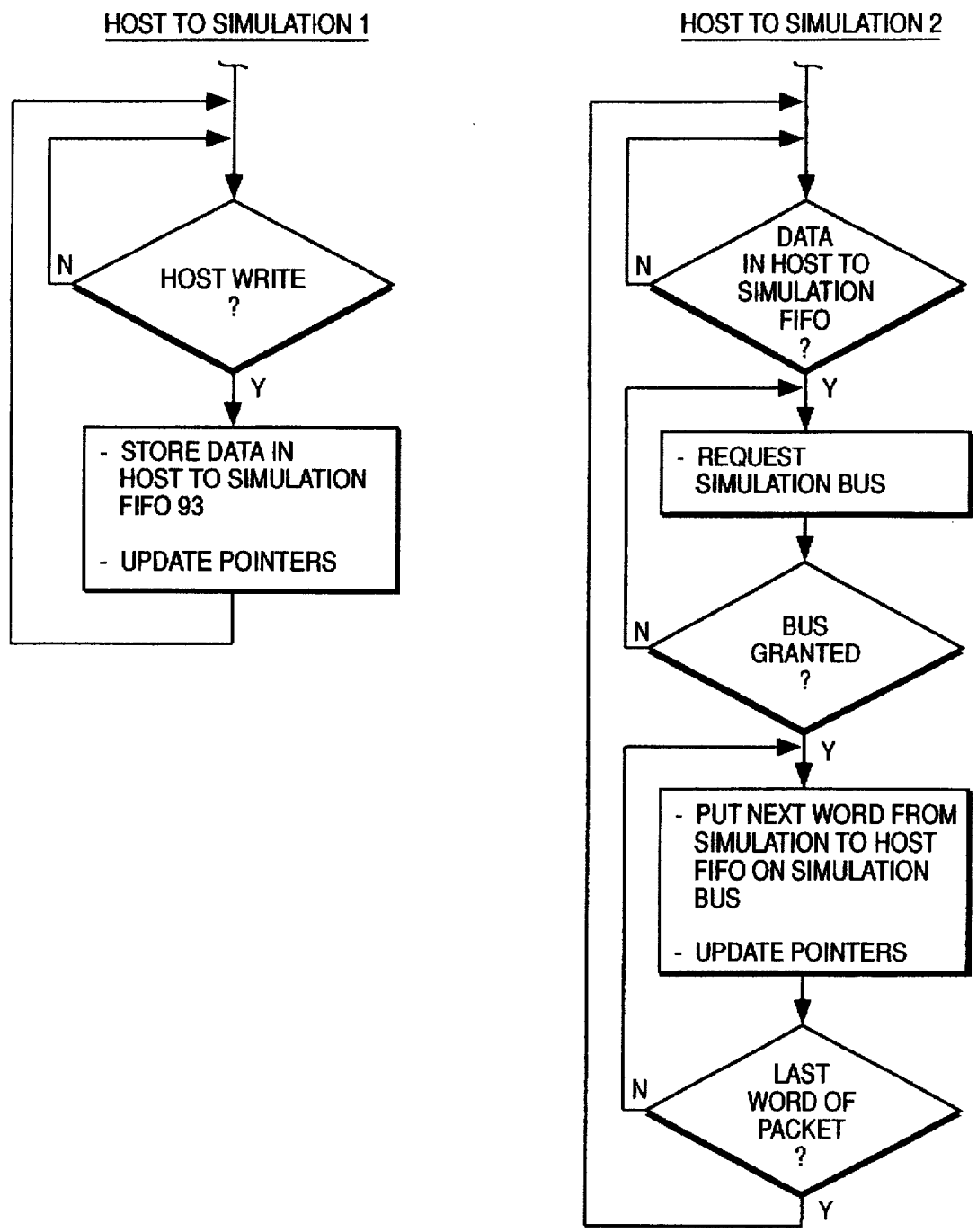
FIGS. 15A and 15B are flow charts to explain operation of the host interface of FIG. 14.
Figure 15B:
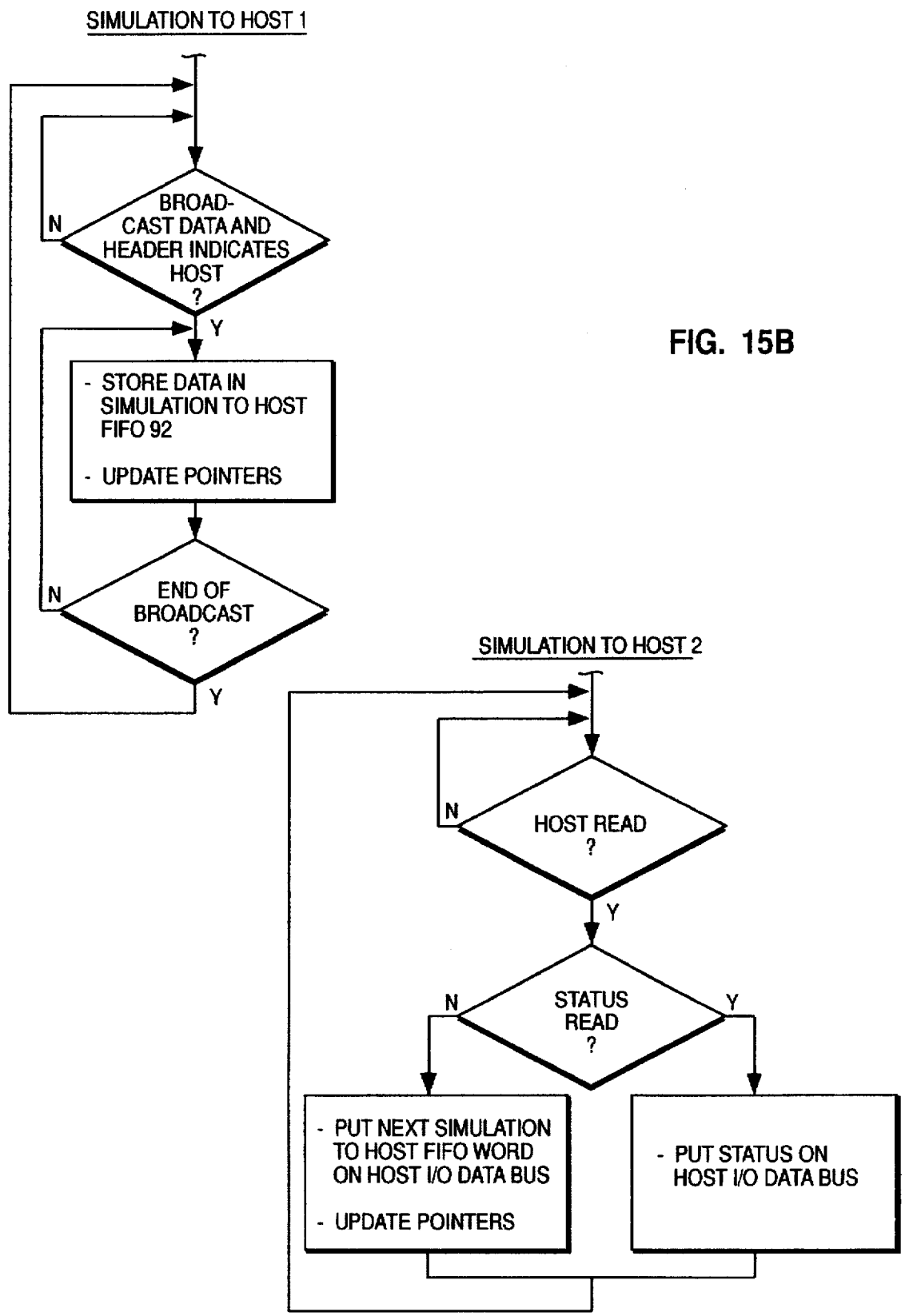

FIG. 15A shows flow charts which explain operation of the host interface 21 to send data from the host 5 to the simulation bus means 3. This operation is executed by the host interface 21 when the host 5 loads the simulation processors 2 with instructions and data before the simulation or modifies data in the simulation processors 2 during the simulation. FIG. 15B shows flow charts which explain operation of the host interface 21 to send data from the simulation processors 2 to the host 5. This operation is executed by the host interface 21 when the Broadcast commands send data from the simulation processors 2 to the host 5 during the Broadcast operation.

Now, referring to FIG. 9, a method of compiling a model to be simulated by the logic simulation machine 1 is explained. The method comprises assigning the instructions of a model to be simulated to each of the simulation processors in "round-robin" fashion in an instruction list to be loaded into the simulation processors 2 from the host computer 5 before a simulation. In the instruction list, the block instructions begin at the first simulation processor, proceed to the 16th processor, and then back to the first processor to repeat the above sequence. The method further comprises inserting a set of 16 identical control instructions for the processors into the instruction list in the same sequence as the block description instructions at a location beginning at k×16 (k is an integer). Each of the sixteen Broadcast commands, however, has different addresses in the fields A1 thru A4 to fetch different data from the current state array 23 and the last four Broadcast commands are Broadcast End commands. 16 is the maximum number in the group (1, 2, 4, 8, 16) from which a user can select the number of the simulation processors 2 to be installed in the logic simulation machine 1 to get a desired performance. In FIG. 9, the block description instructions for each of the simulation processors are arranged by turns, beginning at the first processor, proceeding to the 16th processor, and then backing to the first processor to repeat the above sequence. Sets of the same sixteen control instructions are put at locations from 0FF0 (Broadcast), and from FFF0 (Halt). All sixteen instructions in one cycle are to be operated simultaneously by the simulation processors 2 in the largest configuration. Therefore, all block description instructions in the same cycle must be of the same rank. Block description instructions that begin a new logic rank must begin at a location p×16 (p is an integer) and dead cycles are inserted before the first block of the new rank in order to absorb delay between when an instruction is fetched and when its output is ready due to pipeline operation if the pipeline operation is used. If delayed writeback of computed results is used, that is, if the computed results are written back to the current state array every jth cycle, the new logic rank must begin at a location j×q×16 (j and q are integers).

Now, referring back to FIGS. 1 and 2, the operation of the logic machine 1 is explained. The host computer 5 is used to personalize the simulation processors 2 on power-on operation, to load the simulation processors 2 with instructions and data before the simulation, to evaluate or modify the results during and/or after the simulation, and to interface with user. The host computer 5 personalizes each of the simulation processors 2 directly through the I/O bus means 56. On personalization, the host counts the number of the simulation processors 2 plugged into the I/O slots and tells the simulation processors 2 the number. After the personalization, however, the host does not need to take care of the configuration of the simulation processors 2 as explained later. After the personalization, the host computer 5 communicates with the simulation processors 2 only through the host interface 21 provided in the simulation processor 2 plugged into the slot 0 of the simulation bus means 3 except power supply through the I/O slot.

When loading the instructions into the block description array 22 of each of the simulation processors 2, the host computer 5 sends instructions in the instruction list of FIG. 9 from the top to the bottom to the simulation bus means 3 through the I/O bus 56 and the host interface 21. Each simulation processor 2 takes by turns the instructions and stores them into the block description array 22. Thus, as shown in FIG. 10, the simulation processors 2 plugged into the slot means 0, 1, ..., and 15 store consecutively the block description instructions for gates 0, 16, 32, ..., gates 1, 17, 33, ..., and gates 15, 31, 47, ..., in their block description arrays 22, respectively, and store the same control instructions at the same addresses in the block description arrays 22.

Referring back to FIGS. 1 and 2 again, the host computer 5 loads the same initial states of a whole model to be simulated by the machine 1 into the current state array 23 in each of the simulation processors 2. In this machine 1, the current state array 23 in each simulation processor 2 maintains a complete copy of current states of the whole model being simulated during the simulation as explained later. The host computer also loads the same functional data into the logical functional table 24.

In this loading operation, the host interface 21 receives data or instructions from the host 5 through the host to simulation FIFO 93 and puts these data or instructions on the simulation bus means 3 as explained by the flow charts in FIG. 15A. Namely, the control logic 91 examines if the host 5 writes data into the machine 1. If so, the logic 91 stores data into the FIFO 93 from the I/O bus 56 and updates pointers. The logic 91 also examines if data is in the FIFO 93. Xf so, the logic 91 requests simulation bus grant. If granted, the FIFO 93 puts data on the simulation bus means 3 and updates pointers until the last data in the FIFO 93 is put on the bus 3.

There are two modes in operation of the simulation, running and stopped. When running mode, each simulation processor 2 continuously steps through its block description array 22, evaluating each gate's next state, until it receives a command to stop that can be either imbedded in the block description array 22 or come from the host computer 5. In the stopped mode, no simulation is occurring, and the entire state of the logic simulation machine 1 including the current state array 23 and the block description array 22 is available for inspection and modification by the host computer 5.

In the running mode, this logic simulation machine 1 allows the sixteen simulation processors 2 to work on one simulation model to speed up simulation. In a parallel configuration, each simulation processor 2 evaluates one gate per cycle. At the end of the cycle each simulation processor 2 puts its result on the allocated lines of the data lines 3A in parallel and all the simulation processors 2 update their current state arrays 23 with the results from the data lines 3A.

At each cycle of the running mode, the following steps are synchronously performed in each simulation processor 2 which is plugged into the simulation bus means 3 until a Halt command is found from the block description array 22 or the host computer 5 stops the simulation.

The control logic means 27 sequentially increments the program counter 26 from a start address to sequentially output instructions from the block description array 22. When the block description array 22 is addressed by the program counter 26, it outputs an instruction stored in the corresponding address. The op-code field of the instruction is latched by a latch 61. The op-code field indicates whether it is a block description instruction or a control instruction. If it is a block description instruction, the op-code field describes the function of the gate being evaluated. The fields A1 thru A4 specify four input connections of the gate being evaluated and correspond to addresses in the current state array 23 where the current states of the input connections are stored.

The addresses A1 thru A4 are passed to the array 23 through the multiplexors 62. Four 2-bit current states that are input operands to the gate being evaluated are simultaneously fetched from the addresses designated by the fields A1 thru A4. These input operands are sent to the operand invert logic means 63 so that the operands are inverted if the op-code indicates before the calculation in the logical function table 24.

The input operands to the gate being evaluated are sent to the logical function table 24. This information, along with the function pointer of the op-code field describing the gate's function from the latch 61, serves as a pointer into the logical function table 24. The logical function table 24 is in essence a look up table, and generates a proper 2-bit output value for the gate given its present inputs.

The output of the logical function table 24 is sent to the output invert logic 66 so that the output is inverted if the op-code indicates. The result from the output invert logic means 66 is supplied to the outputting means 25 to be put on the allocated lines of the data lines 3A in order to update all the current state arrays 23 in the machine 1 with the result.

For example, the AND gate shown in FIG. 5 is evaluated as follows: The program counter 26 of the simulation processor plugged into the slot 0 generates an address Z to fetch the block description instruction of the gate from the block description array 22. Four operands H(0,1), H(0,1), L(0,0), and L(0,0) are fetched from the addresses V, W, X, and Y in the current state array 23 as designated by the fields A1 thru A4 of the block description instruction. The first and the second input operands H(0,1) and H(0,1) are inverted to L(0,0) and L(0,0) in the operand invert logic 63 by the op-code. All four L(0,0) input operands and an function pointer specifying AND function are inputted to the table 24. The table 24 outputs a result, L(0,0). This result is inverted to H(0,1) in the output invert logic means 66 by the op-code. The output H(0,1) is supplied to the outputting means 25 to transfer through the allocated data lines to all the simulation processors 2 to update their current state arrays 23.

As explained before, the processors 2 in the slots 0, 1, 2, ..., and 15 put their 2-bit results on the allocated lines 0 and 1, 2 and 3, 4 and 5, ..., and 30 and 31 of the data lines 3A, respectively. In this way, all results calculated in this cycle appear on the data lines 3A in parallel. The results on the data lines 3A are received by the control logic means 27 and are written back to 16 adjacent addresses beginning at an address designated by the product of the simulation cycle number and the number of the simulation processors in the configuration (16 in this embodiment), in the current state array 23 in each of the processors 2 at the end of each simulation cycle. For example, at the end of the first simulation cycle, addresses 0 thru 15 in the current state arrays 23 of all the simulation processors are updated with the results on the data lines 3A. At the end of second simulation cycle, addresses 16 thru 31 in the current state array 23 are updated with the results on the lines 3A. At the end of the third simulation cycle, addresses 32 thru 47 and so on. In this way, the current state array 23 in each simulation processor 2 is updated with the results calculated at each simulation cycle by all of the processors 2 and keeps a complete copy of current states of the model being evaluated in the machine 1. The host computer 5 can receive the results through the data lines 3A and the host interface 21 during the simulation by the Broadcast command as explained later.

When the simulation processors 2 execute the control instructions, Branch, Broadcast, Halt, etc., the identical control instructions are executed simultaneously in all of the simulation processors 2 for proper synchronization of the simulation. For, example, Branches are resolved identically across all simulation processors 2 at a time.

As shown in FIG. 16, the sixteen Broadcast commands executed by the processors 2 in the machine 1 take four simulation cycles to put the data on the data lines 3A since only four Broadcast commands can put data on the data lines in parallel at a time. The Broadcast commands are fetched from the block description array 22 and executed in each of the simulation processors 2. Each of the Broadcast commands fetches four 2-bit data from the current state array 23 indicated by the addresses in the fields A1 thru A4 in the same way as the block description instruction. The four operands from the array 23 may be inverted by the inversion bits before being sent to the host 5 in the operand invert logic means 63. At the first cycle of the four Broadcast cycles, the control logic 27 in all the simulation processors 2 sends clock signal (0,0) through the clock lines 81 to its bus steering means 80 (FIG. 13) so that the Broadcast commands executed by the simulation processors 2 plugged into the slot means 0, 1, 2, and 3 put the 8-bit data from the current state array 23 on the data lines 0 thru 7, 8 thru 15, 16 thru 23, and 24 thru 31, respectively. At the second cycle of the four Broadcast cycles, the control logic 27 sends clock signal (0,1) to the bus steering means 80 so that the Broadcast commands executed by the processors 2 in the slot means 4, 5, 6, and 7 put the 8-bit data on the data lines 0 thru 7, 8 thru 15, 16 thru 23, and 24 thru 31, respectively. At the third cycle of the four Broadcast cycles, the control logic 27 sends clock signal (1,0) to the bus steering means 80 so that the Broadcast commands executed in the processors 2 plugged into the slot means 8, 9, 10, and 11 put the 8-bit data on the data lines 0 thru 7, 8 thru 15, 16 thru 23, and 24 thru 31, respectively. At the fourth cycle of the four Broadcast cycles, the control logic sends clock signal (1,1) to the bus steering means 80 so that the Broadcast commands which are Broadcast End commands and which are executed by the processors plugged into the slot means 12, 13, 14 and 15 put the 8-bit data on the data lines 0 thru 7, 8 thru 15, 16 thru 23, and 24 thru 31, respectively.

In this way, the Broadcast commands send data from the current state arrays 23 to the host 5. The two bits from the nodes in the current state array 23 are concatenated into an eight bit byte in each of the simulation processors 2. The Broadcast commands always exist in sets of four, generating a 32 bit word that is sent to the host 5. Multiple sets of four Broadcast commands residing in the block description arrays 22 can generate any packet of information desired. Any node in the current state array 23 can be incorporated into the packet by pointing to it with the address. In this way any combination of current state array data can be combined in a packet and sent to the host. The invert bits in the Broadcast commands are valid so that node data can be pre-inverted before it is incorporated into the packet.

As shown in FIG. 15B, the host interface 21 receives the packet on the data lines 3A, stores the data in the simulation to host FIFO 92 and updates pointers if the header of the packet indicates the host destination. It stores all subsequent data until the end of the packet is indicated on the control line. The host interface 21 sends the data from the FIFO 92 to the host 5 through the I/O bus 56 and updates pointers when the host 5 reads the data from the machine 1. The host interface 21 also sends status data indicating whether the simulation machine 1 is running or not and the state of the FIFO buffers when the host 5 reads the status.

Two examples are given to show the uses intended for the Broadcast command. The first is RAM array packet. The host 5 performs the RAM array processing in the simulation. The other is trace data. In order to minimize the host interaction during simulation, the data the user wants to trace is sent to the host in packets at the end of each cycle.

The Broadcast command has two advantages over the host getting the data directly. Nodes from disparate addresses in the current state array 23 can be collected efficiently. In direct access mode, the host can only get adjacent nodes efficiently. If a facility has its nodes scattered (a requirement if they are generated on different ranks), the host could take several cycles to accumulate the required data. With the Broadcast command there is no penalty for collecting any arbitrary pattern of nodes. In addition, waiting for the host is minimized. While the machine will have to wait for the host if the FIFO buffer is full, it can start simulating again as soon as the last data is put in the FIFO.

The Broadcast command has been presented as if the host were the only place the data is sent to. In reality, the Broadcast command only puts data on the simulation bus means 3. Its final destination is determined by the hardware configuration. For example, if an auxiliary processor performing an array management function were present, the RAM array packets would go to the auxiliary processor instead of the host. The simulation processor 2 does not care. It just builds the packets on the bus. Their final destination is handled by hardware of the bus means 3 which builds the header of the packets indicating destination of the packet, the host 5 or the auxiliary processor 4. If the header of the packet indicates the auxiliary processor destination, the host interface 21 does not receive the packet.

In this machine 1, plural simulation processors 2 work on a simulation model in parallel to speed up the simulation, this allows an almost linear speedup, that is, twice as many simulation processors run twice as fast. The non-linearity of the speedup is only due to the updating requirement, since a higher proportion of time will be spent writing data back into the current state arrays. Although 16 simulation processors 2 are connected with the simulation bus means 3 in this example, any number of simulation processors selected from the group consisting of 1, 2, 4, 8, and 16 is able to be connected with the simulation bus means 3 depending on a desired performance. The configuration of the simulation processors 2 is kept transparent from the host computer 5 and the same model built for the largest configuration can be used irrespective of the changes in the configuration because the control logic 27 and the configuration lines 3C inform the simulation processors of the configuration to take care of the configuration change by themselves. And after the personalization of the simulation processors 2, the host computer 5 communicates with the logic simulation machine 1 through the host interface 21 of the processor 2 plugged into the slot 0 of the simulation bus means 3. Then, the group of the simulation processors 2 appear to the host computer 5 as a single entity with respect to a number of tasks; building the simulation model, loading it into the simulator, running the simulation, and fetching the results for analysis.

If four simulation processors 2 are connected with the simulation bus means 3 instead of sixteen simulation processors, the four simulation processors 2 are plugged into the slots 0, 1, 2, and 3 and receive unique data from the configuration lines 3C, respectively. When loading of the instructions into the block description array 22 in each of the simulation processors 2, each simulation processor 2 receives by turns and stores the instructions in the block description arrays 22 as shown in FIG. 11.

Four gates are evaluated at one simulation cycle in this configuration. The results of the four gates evaluated by the four processors 2 appear on the lines 0 thru 7 of the data lines 3A in parallel at the end of the first cycle of every four cycles, on the lines 8 thru 15 at the end of the second cycle of every four cycles, on the lines 16 thru 23 at the end of the third cycle of every four cycles, and on the lines 24 thru 31 at the end of the fourth cycle of every four cycles. This is done by sending data (0,0) at the first cycle, (0,1) at the second cycle, (1,0) at the third cycle, and (1,1) at the forth cycle from the control logic 27 to the outputting means 25 through the most and the second significant configuration lines of the configuration lines 3C (FIG. 8). At the end of the forth cycle, all the data lines 3A have the results thereon and the results are written back to sixteen adjacent addresses in the current state array 23 beginning at an address designated by the product of the first simulation cycle number of every four cycles and the number of the simulation processors, four. Namely, at the end of every four cycles when all the data lines 3B are filled with the results from the processors 2, the current state array 23 in each of the simulation processors 2 are updated with the results on the data lines 3B. This configuration needs four simulation cycles to evaluate the same sixteen gates while the configuration of FIG. 1 needs one simulation cycle.

Figure 11:
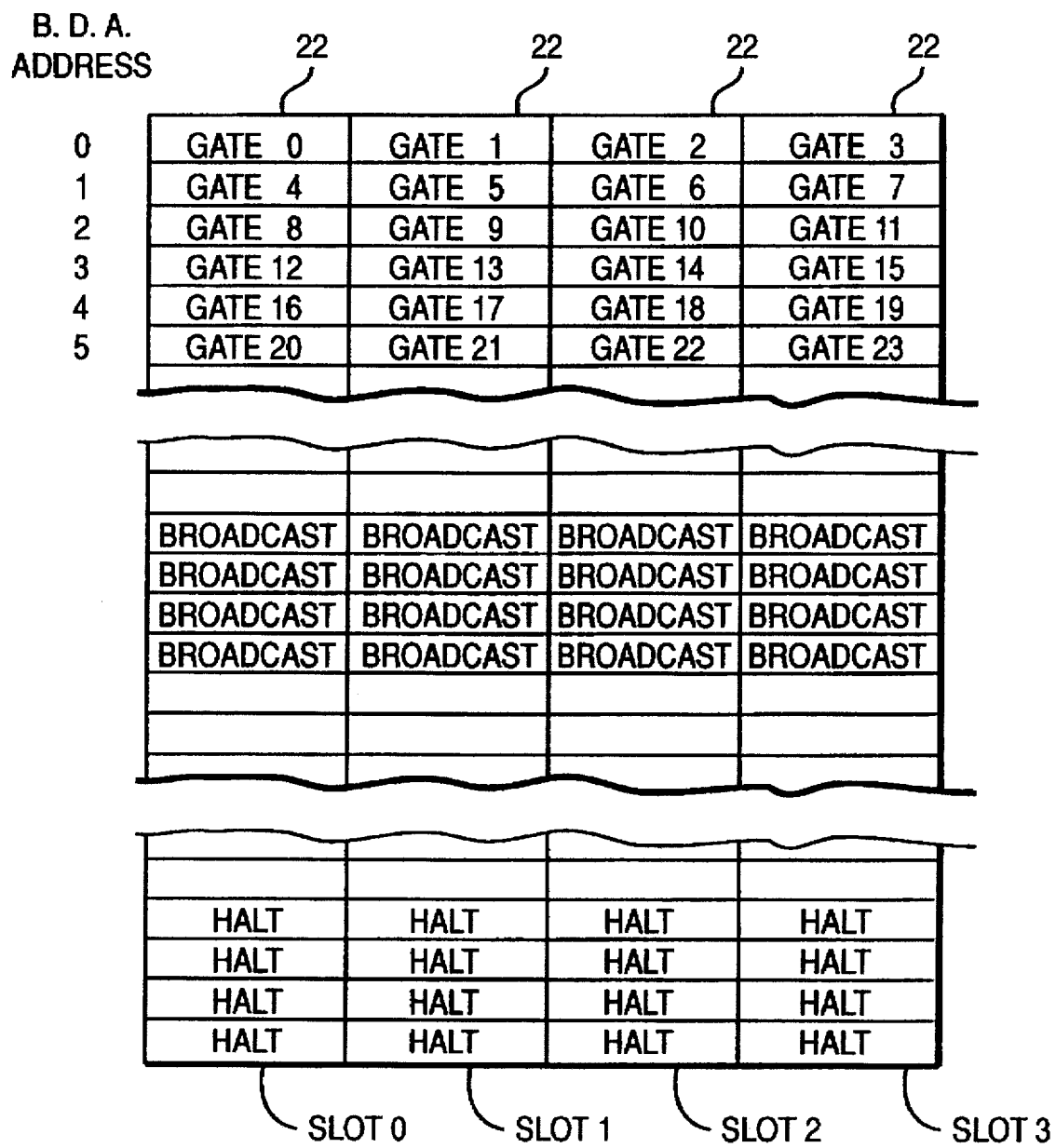
FIG. 11 is a simplified illustration of the block description arrays of the logic simulation machine of another configuration.

In the four processor configuration as shown in FIG. 11, each block description array 22 has four identical control instructions in four adjacent addresses. Each control logic means 27 in the processors 2 executes the first Branch or Halt control instruction of the four identical control instructions and neglects the other three redundant identical control instructions since the four Branch or Halt commands have the same contents.

Figure 17:
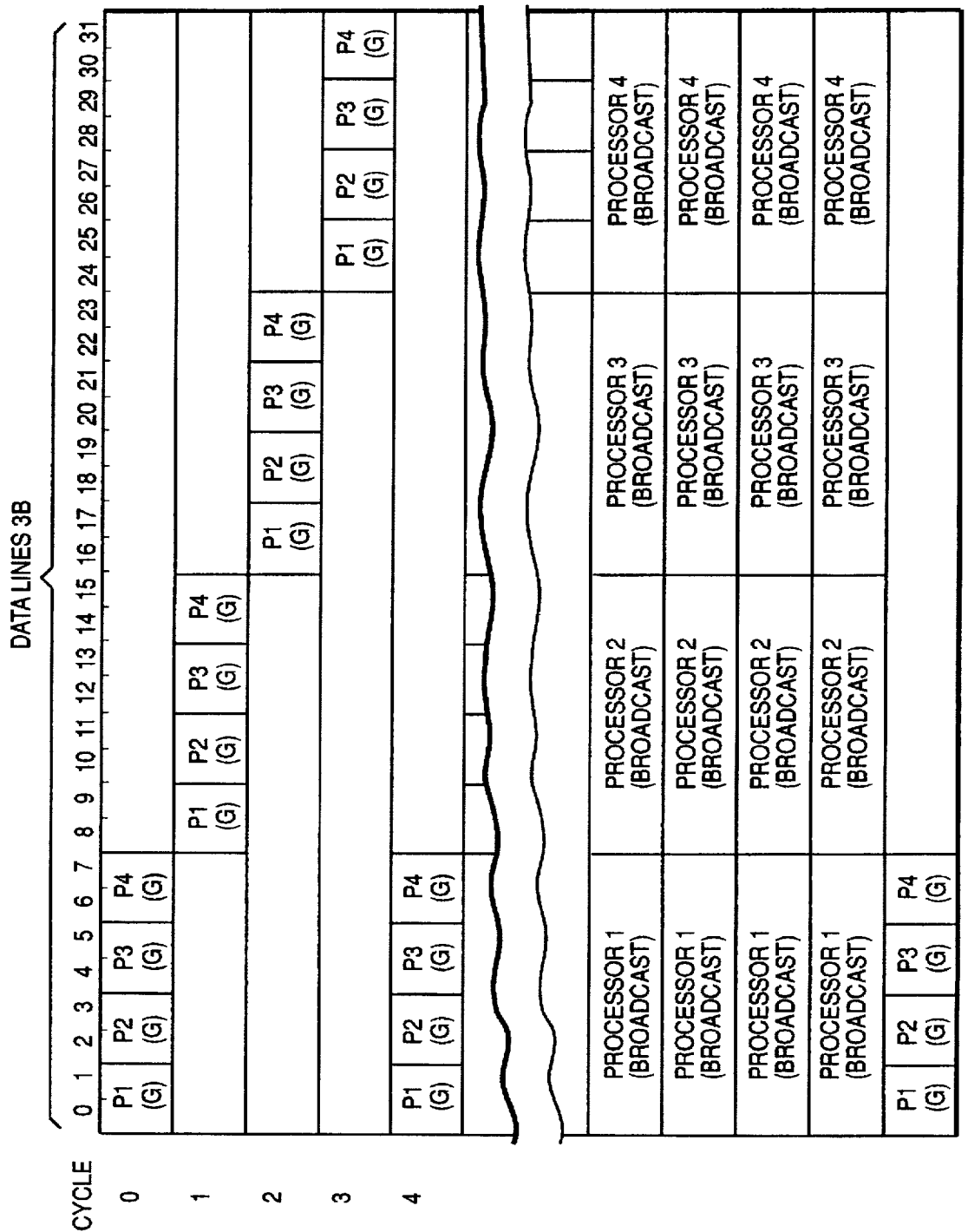
FIG. 17 is a schematic diagram to explain how the logic simulation machine of another configuration puts data on the simulation bus means during gate evaluation and Broadcast operation.

However, as shown in FIG. 17, all the sixteen Broadcast instructions are executed by the processors 2 since each Broadcast command contains different addresses in the fields A1 thru A4 to transfer data from the array 23 to the host 5. It takes four cycles to send the data. The control logic 27 sends clock signal (0,0) during the four cycles to the bus steering means 80 through the clock lines 81 (FIG. 13) so that the processors 2 plugged into the slot means 0 thru 3 put data on the lines 0 thru 31 at the end of each of the four cycles. If there are eight processors 2 connected to the bus 3, it also takes four cycles to execute the sixteen Broadcast commands and the control logic 27 sends alternately clock signal (0,0) and (0,1) during the four cycles to the bus steering means 80 so that the processors plugged into slot 0 thru 3 and 4 thru 7 put alternately data on the lines 3A.

The machine 1 makes the number of simulation processors transparent to software. This means that architecturally 16 block description instructions are always executed simultaneously. In fact, this may take 1, 2, 4, 8, or 16 cycles, depending on the number of the simulation processors, but the software does not see a difference. When the host computer accesses the block description arrays in the simulation processors for loading or other purposes, it sees simply one set of instructions. Physically., the hardware of the simulation processors may direct the host's accesses to different arrays on multiple cards, but the host does not see this. If a logic model to be simulated is built for the largest configuration of the logic simulation machine the model will run on any smaller configuration without any modification. This concept allows the same model to be used across many hardware configurations. The host does not need to know the configuration but Just sends all host data to the I/O bus regardless of the configuration. This is important particularly because the architecture of this embodiment allows the user to reconfigure the logic simulation machine at any time in order to get a desired performance.

In the simulation, the simulation processors 2 will normally be used to simulate only gate logic, functions such as memory or array modelling and device behavioral will be performed by the host computer 5. However, in the machine 1 shown in FIG. 1, all data to and from the host computer 5 goes on the simulation bus means 3, the host becomes just another device on the bus 3. This implies that any host function can be done by a hardware accelerator or an auxiliary processor which is plugged into the simulation bus means 3 in parallel with the simulation processors 2 by mimicking the traffic on the simulation bus 3. Obvious candidates for the hardware accelerator or the auxiliary processor is trace collection, memory or array simulation, and device behavioral, where the host may be slowing down the simulation throughput. In fact, all functions except user interface could be migrated to an auxiliary processor to relieve such a host work. The auxiliary processor 4 is such an auxiliary processor and may receive data put on the simulation bus 3 by the Broadcast command to perform such host function.

In the embodiment, two First-In First-Out buffers are incorporated into the host interface in the logic simulation machine. The most obvious advantage is the decoupling between the host and the logic simulation machine. Data from the host can be buffered in the FIFO until the logic simulation machine is ready to receive it. Data from the logic simulation machine to the host can be buffered in FIFO without requiring the machine to wait for the host to take it. Neither the host nor the logic simulation machine wastes time waiting. Moreover, using two commands in the logic simulation machine, The FIFO host interface provides two important throughput enhancements beyond the immediate decoupling advantage. Firstly, coupled with the Broadcast command, the interface allows multiple packets of information to be sent to the host. These packets can be sent from by the logic simulation machine at its speed and buffered by the FIFO until the host can process them. By sending off jobs to the host early in the simulation cycle, the host can be processing the packets while the logic simulation machine is evaluating other gates that do not require a result from the host. Without the FIFO the Broadcast command would be nothing more than a gate with four output parameters. With the FIFO the Broadcast command becomes a powerful means of communicating with the host. Secondly, the Branch on condition command allows the logic simulation machine to wait for the host to provide data. if the host has already returned the required data (and cleared the flag used in the conditional branch) the logic simulation machine continues without having waited for the host at all. With the proper model, that is, if requests for data are separated from the need for data as much as possible, it is theoretically possible that all host processing can be done in parallel with the logic simulation machine. Even if this is not achieved, the FIFO host interface allows as much parallelism as is practical.

Although, in the logic simulation machine of FIG. 1, the number of the simulation processors connected to the simulation bus means is $2^n$ and the maximum number is sixteen, the host interface of the invention is able to be used in a logic simulation machine which contains any number of the simulation processors.

While the invention has been particularly shown and described with reference to preferred embodiment thereof, it will be understood by those skilled in the art that changes in form and details may be made therein without departing from the spirit and scope of the invention.

What is claimed is:

1. A host interface for a logic simulation machine having a plurality of simulation processors for transferring data between the logic simulation machine and a host computer, comprising:

a parallel simulation bus means provided in the logic simulation machine coupled to each of the simulation processors in parallel for providing concurrent transfer of data by each of the simulation processors with the host computer, each simulation processor generating simulation data and concurrently transferring said simulation data on a different portion of the parallel simulation bus;

a First-In First-Out buffer means provided between the parallel simulation bus means and the host computer; and a control means coupled to the First-In First-Out buffer means for controlling the First-In First-Out buffer means wherein the First-In First-Out buffer means temporarily stores on demand data being concurrently transferred between a plurality of the simulation processors in the logic simulation machine and the host computer until a receiver of the data is ready to receive the data.

2. The host interface for a logic simulation machine according to claim 1 wherein the First-In First-Out buffer means further includes:

a host to simulation First-In First-Out buffer for storing on demand data from the host computer and sending the data to the logic simulation machine; and a simulation to host First-In First-Out buffer for storing on demand data from the logic simulation machine and sending the data to the host computer.

3. The host interface for a logic simulation machine according to claim 1 wherein the host computer includes an I/O bus means for communicating with the logic simulation machine, and the First-In First-Out buffer means is provided between the parallel simulation bus means and the I/O bus means.

4. A method of transferring data between a host computer and a logic simulation machine having a plurality of simulation processors including a parallel simulation bus means and a First-In First-Out buffer means connected between the parallel simulation bus means and the host computer, comprising the steps of:

temporarily storing on demand data being concurrently sent from a plurality of the simulation processors in the logic simulation machine across the parallel simulation bus means to the host computer in the First-In First-Out buffer means until the host computer is ready to receive the data, each simulation processor generating simulation data and concurrently transferring said simulation data on a different portion of the parallel simulation bus; and temporarily storing on demand data being sent from the host computer across the parallel simulation bus means to the logic simulation in the First-In First-Out buffer means until the logic simulation machine is ready to receive the data.

5. The method according to claim 4 further including the steps of:

sending the data from the First-In First-Out buffer means to the host computer when the host computer is ready to receive the data from the logic simulation machine; and sending the data from the First-In First-Out buffer means to the logic simulation machine when the logic simulation machine is ready to receive the data from the host computer.

6. The method according to claim 4 wherein the First-In First-Out buffer means includes a simulation to host First-In First-Out buffer for temporarily storing on demand the data being sent from the logic simulation machine to the host computer and a host to simulation First-In First-Out buffer for temporarily storing on demand the data being sent from the host computer to the logic simulation machine.

7. A host interface for a logic simulation machine for transferring data between the logic simulation machine and a host computer, comprising:

a plurality of simulation processors provided in the logic simulation machine for parallel processing;

a parallel simulation bus means provided in the logic simulation machine coupled to each of the simulation processors in parallel for providing concurrent transfer of data by each of the simulation processors with the host computer, each simulation processor generating simulation data and concurrently transferring said simulation data on a different portion of the parallel simulation bus;

a First-In First-Out buffer means provided between the parallel simulation bus means and the host computer; and a control means coupled to the First-In First-Out buffer means for controlling the First-In First-Out buffer means wherein the First-In First-Out buffer means temporarily stores on demand data being concurrently transferred in parallel between a plurality of the simulation processors in the logic simulation machine and the host computer until a receiver of the data is ready to receive the data.

8. The host interface for a logic simulation machine according to claim 7 wherein the First-In First-Out buffer means further includes:

a host to simulation First-In First-Out buffer for temporarily storing on demand data from the host computer and sending the temporarily stored data to the logic simulation machine; and a simulation to host First-In First-Out buffer for temporarily storing on demand data from the logic simulation machine and sending the temporarily stored data to the host computer.

9. The host interface for a logic simulation machine according to claim 7 wherein the host computer includes an I/O bus means for communicating with the logic simulation machine, and the First-In First-Out buffer means is provided between the parallel simulation bus means and the I/O bus means.

10. A host interface for a logic simulation machine for transferring data between the logic simulation machine and a host computer, comprising:

a plurality of simulation processors provided in the logic simulation machine for parallel processing;

a parallel simulation bus means provided in the logic simulation machine coupled to each of the simulation processors in parallel for providing concurrent transfer of data by each of the simulation processors with the host computer, each simulation processor generating simulation data and concurrently transferring said simulation data on a different portion of the parallel simulation bus;

a plurality of First-In First-Out buffer means provided between each of the parallel simulation bus means and the host computer; and a plurality of control means, each control means coupled to one of the First-In First-Out buffer means for controlling the coupled First-In First-Out buffer means wherein the coupled First-In First-Out buffer means temporarily stores data being concurrently transferred in parallel between a plurality of the simulation processors in the logic simulation machine and the host computer until a receiver of the data is ready to receive the data.

11. The host interface for a logic simulation machine according to claim 10 wherein the First-In First-Out buffer means further includes:

a host to simulation First-In First-Out buffer for temporarily storing data from the host computer and sending the temporarily stored data to the logic simulation machine; and a simulation to host First-In First-Out buffer for temporarily storing data from the logic simulation machine and sending the temporarily stored data to the host computer.

12. The host interface for a logic simulation machine according to claim 10 wherein the host computer includes an I/O bus means for communicating with the logic simulation machine, and the First-In First-Out buffer means is provided between the parallel simulation bus means and the I/O bus means.

* * * * *